(12) United States Patent
Shibazaki

(10) Patent No.: US 7,852,034 B2
(45) Date of Patent: Dec. 14, 2010

(54) DRIVE METHOD OF MOVING BODY, STAGE UNIT, AND EXPOSURE APPARATUS

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 387 days.

(21) Appl. No.: 11/547,245

(22) PCT Filed: Apr. 6, 2005

(86) PCT No.: PCT/JP2005/006739

§ 371 (c)(1),
(2), (4) Date: Nov. 28, 2006

(87) PCT Pub. No.: WO2005/098911

PCT Pub. Date: Oct. 20, 2005

(65) Prior Publication Data

US 2008/0143994 A1 Jun. 19, 2008

(30) Foreign Application Priority Data

Apr. 9, 2004 (JP) ............................. 2004-116043

(51) Int. Cl.
*B64C 17/06* (2006.01)
(52) U.S. Cl. ................. 318/649; 318/652; 318/650
(58) Field of Classification Search ................. 318/649, 318/652, 650
See application file for complete search history.

(56) References Cited

U.S. PATENT DOCUMENTS 4,780,617 A 10/1988 Umatate et al.
5,448,332 A 9/1995 Sakabiara et al.
5,528,118 A 6/1996 Lee
5,646,413 A 7/1997 Nishi
5,693,439 A 12/1997 Tanaka et al.
5,744,924 A 4/1998 Lee
5,844,247 A 12/1998 Nishi
5,874,820 A 2/1999 Lee (Continued)

FOREIGN PATENT DOCUMENTS

GB 2 288 277 A 10/1995

(Continued)

OTHER PUBLICATIONS

Search Report for Application No. 05728443.02; mailed Feb. 10, 2010.

(Continued)

*Primary Examiner*—Karen Masih
(74) *Attorney, Agent, or Firm*—Oliff & Berridge, PLC

(57) ABSTRACT

An exposure apparatus that comprises a stage-that moves in the X-axis direction, an X-axis linear motor that drives the stage, a counter mass that moves in a direction opposite to the stage due to the action of the reaction force of the drive force of the stage in the X-axis direction by the motor, X-axis trim motors that drives the counter mass in the X-axis direction, and a control unit that controls the trim motors and gives the counter mass an initial velocity in the +X direction when the stage is moved via the motor, for example, in the +X direction. Accordingly, the strokes required for the movement of the counter mass can be shortened without increasing the size of the counter mass.

46 Claims, 13 Drawing Sheets

U.S. PATENT DOCUMENTS

| | | |
|---|---|---|
| 5,942,871 A | 8/1999 | Lee |
| 5,982,128 A | 11/1999 | Lee |
| 6,008,500 A | 12/1999 | Lee |
| 6,020,710 A | 2/2000 | Lee |
| 6,049,186 A | 4/2000 | Lee |
| 6,051,843 A | 4/2000 | Nishi |
| 6,087,797 A | 7/2000 | Lee |
| 6,150,787 A | 11/2000 | Lee |
| 6,151,105 A | 11/2000 | Lee |
| 6,175,404 B1 | 1/2001 | Lee |
| 6,188,195 B1 | 2/2001 | Lee |
| 6,246,202 B1 | 6/2001 | Lee |
| 6,246,204 B1 | 6/2001 | Ebihara et al. |
| 6,252,370 B1 | 6/2001 | Ebihara et al. |
| 6,255,795 B1 | 7/2001 | Ebihara et al. |
| 6,255,796 B1 | 7/2001 | Ebihara et al. |
| 6,271,640 B1 | 8/2001 | Lee |
| 6,279,881 B1 | 8/2001 | Nishi |
| 6,281,654 B1 | 8/2001 | Lee |
| 6,316,901 B2 | 11/2001 | Lee |
| 6,323,935 B1 | 11/2001 | Ebihara et al. |
| 6,329,780 B1 | 12/2001 | Ebihara et al. |
| 6,359,679 B1 | 3/2002 | Ito et al. |
| 6,498,352 B1 | 12/2002 | Nishi |
| 6,608,681 B2 | 8/2003 | Tanaka et al. |
| 6,683,433 B2 | 1/2004 | Lee |
| 6,693,402 B2 | 2/2004 | Ebihara et al. |
| 6,747,732 B1 | 6/2004 | Lee |
| 6,841,965 B2 | 1/2005 | Lee |
| 6,844,695 B2 | 1/2005 | Ebihara et al. |
| 6,844,696 B2 | 1/2005 | Ebihara et al. |
| 6,885,430 B2 | 4/2005 | Tanaka et al. |
| 6,927,840 B2 | 8/2005 | Lee |
| 6,958,808 B2 | 10/2005 | Tanaka et al. |
| 6,969,966 B2 | 11/2005 | Ebihara et al. |
| 6,989,647 B1 | 1/2006 | Lee |
| 7,012,398 B2 | 3/2006 | Ebihara et al. |
| 7,365,513 B1 | 4/2008 | Lee |
| 7,573,225 B2 | 8/2009 | Ebihara |
| 2001/0019250 A1 | 9/2001 | Lee |
| 2001/0030522 A1 | 10/2001 | Lee |
| 2002/0017889 A1 | 2/2002 | Lee |
| 2002/0017890 A1 | 2/2002 | Ebihara et al. |
| 2002/0075467 A1 | 6/2002 | Tanaka et al. |
| 2002/0176082 A1 | 11/2002 | Sakakibara et al. |
| 2003/0142281 A1 | 7/2003 | Nishi |
| 2003/0184253 A1 | 10/2003 | Ebihara et al. |
| 2003/0184254 A1 | 10/2003 | Ebihara et al. |
| 2004/0012768 A1 | 1/2004 | Tanaka et al. |
| 2004/0051854 A1 | 3/2004 | Tanaka et al. |
| 2004/0095085 A1 | 5/2004 | Lee |
| 2004/0119436 A1 | 6/2004 | Binnard et al. |
| 2004/0158427 A1 | 8/2004 | Binnard et al. |
| 2005/0002009 A1 | 1/2005 | Lee |
| 2005/0083006 A1 | 4/2005 | Ebihara et al. |
| 2005/0088133 A1 | 4/2005 | Ebihara et al. |
| 2005/0280390 A1 | 12/2005 | Ebihara |
| 2008/0180053 A1 | 7/2008 | Lee |
| 2008/0192226 A1* | 8/2008 | Shibazaki .............. 355/72 |
| 2010/0073653 A1* | 3/2010 | Shibazaki .............. 355/53 |

FOREIGN PATENT DOCUMENTS

| | | |
|---|---|---|
| GB | 2 290 568 A | 1/1996 |
| GB | 2 290 658 A | 1/1996 |
| JP | A 61-44429 | 3/1986 |
| JP | A-61-044429 | 3/1986 |
| JP | A-06-283403 | 10/1994 |
| JP | A 6-283403 | 10/1994 |
| JP | A-07-176468 | 7/1995 |
| JP | A 7-176468 | 7/1995 |
| JP | 08-063231 | 3/1996 |
| JP | A 8-63231 | 3/1996 |
| JP | 08-330224 | 12/1996 |
| JP | A 8-330224 | 12/1996 |
| JP | A 2000-206279 | 7/2000 |
| JP | A-2000-206279 | 7/2000 |
| JP | A-2002-208562 | 7/2002 |
| JP | A 2002-208562 | 7/2002 |
| JP | A 2003-243279 | 8/2003 |
| JP | A 2004-140145 | 5/2004 |
| WO | WO 99/49504 | 9/1999 |
| WO | WO 03/063212 A1 | 7/2003 |

OTHER PUBLICATIONS

ISR and Written Opinion w/translation for Application No. PCT/JP2005/006739; mailed Aug. 2, 2005 (with translation).

European Office Action for Application No. 05 728 443.2; mailed Jun. 2, 2010.

* cited by examiner

DRIVE METHOD OF MOVING BODY, STAGE UNIT, AND EXPOSURE APPARATUS

TECHNICAL FIELD

The present invention relates to driving methods of moving bodies, stage units, and exposure apparatus, and more particularly to a drive method in which a first moving body and a second moving body that moves in a direction opposite to the first moving body by the reaction force of the drive force of the first moving body are driven, a stage unit to which the drive method is applied, and an exposure apparatus that is equipped with the stage unit.

BACKGROUND ART

Conventionally, in a lithography process for manufacturing a semiconductor device, a liquid crystal display device or the like, exposure apparatus such as a reduction projection exposure apparatus by a step-and-repeat method (the so-called stepper) or a scanning projection exposure apparatus by a step-and-scan method (the so-called scanning stepper (also called a scanner)) are relatively frequently used.

With these types of exposure apparatus, in order to transfer a pattern of a reticle serving as a mask onto a plurality of shot areas on a wafer, a wafer stage is driven, for example, by a drive unit including a linear motor or the like in an XY two-dimensional direction. The reaction force generated by the drive of the wafer stage was treated by mechanically releasing the reaction force to the floor (ground), using a frame member arranged at a datum (such as a base plate which is a reference point of the floor surface or the apparatus) which is insulated from vibration from the stage (for example, refer to Patent Document 1). Besides such treatment, in order to absorb the reaction force generated by the drive of the reticle stage in the scanning stepper, there were cases where a counter mass mechanism was employed that mainly used the law of conservation of momentum uniaxially in the scanning direction (for example, refer to Patent Document 2 below).

However, from the level required in fine processing, the reaction force released at the datum gave vibration to the projection optical system or to the stage to no small extent, and especially in the scanning stepper that performs scanning exposure while scanning the stage (or consequently, the wafer or the reticle), the vibration caused by the reaction force was a factor that caused a decrease in the exposure accuracy.

Further, transmission of the reaction force can be prevented almost completely in the case when the reaction force is absorbed using the counter mass mechanism; however, in the conventional counter mass mechanism, because a counter mass was used that moves in a direction opposite to the drive direction of the stage by a distance proportional to the driving distance of the stage, strokes corresponding to all the strokes of the stage had to be prepared also for the counter mass, which led to an increase in the size of the exposure apparatus.

Under such circumstances, with the aim of performing exposure with good accuracy and suppressing the increase in the size of the apparatus, the applicant had made a proposal earlier of an exposure apparatus that is equipped with a counter stage which moves in an opposite direction of a stage that holds an object according to the movement of the stage and a correction unit which has at least a part of the unit connected to the counter stage and corrects the position of the counter stage when an exposure beam is not irradiated (refer to Patent Document 3).

However, in the exposure apparatus disclosed in Patent Document 3 referred to above, because free motion of the counter stage was allowed according to the law of conservation of momentum in response to the movement of the stage and the position of the counter stage was corrected with the correction unit at an appropriate timing after the movement, a stage with a mass larger than that of the stage had to be employed as the counter stage in order to keep the movement stroke range of the counter stage from increasing unnecessarily. Especially in the case of a dual axis stage shaped in the letter H, as is disclosed in FIG. 2 of Patent Document 3 or the like, the stroke range of a stator (the counter stage) that constitutes a linear motor with a mover on the wafer stage side is preferably small, which meant that the mass of the stator (the counter stage) had to be large to some extent. Accordingly, in the current situation, it is not necessarily the case that the size of the apparatus is small enough to satisfy a sufficient level.

Patent Document 1: U.S. Pat. No. 5,528,118 description,
Patent Document 2: U.S. Pat. No. 6,255,796 description, and
Patent Document 3: U.S. Patent Application Publication No. 2004/0012768 description.

DISCLOSURE OF INVENTION

Means for Solving the Problems

The present invention has been made in consideration of the situation described above, and according to a first aspect of the present invention, there is provided a first drive method of a moving body in which a first moving body that moves in at least a first axis direction and a second moving body that moves in an opposite direction of the first moving body due to a reaction force of a drive force in the first axis direction of the first moving body are driven wherein when the first moving body moves in a first direction out of two directions in the first axis direction, an initial velocity in the first direction is given to the second moving body.

In this case, "two directions in the first axis direction" refers to a direction pointing from one side of the first axis direction to the other side of the first axis direction and a direction pointing from the other side of the first axis direction to the other side of the first axis direction. Accordingly, "the first direction" is one of the two directions, and either may be chosen.

Further, the movement of the first moving body in the first direction includes movement accompanied with acceleration, such as a step movement.

With this method, because an initial velocity in the first direction is given to the second moving body when the first moving body moves in the first direction, in the case the system including the first moving body and the second moving body follows the law of conservation of momentum, when the first moving body moves in the first direction, the second moving body moves in the direction opposite to the first direction receiving the reaction force of the drive force. However, at this point, a movement in the first direction due to the initial velocity is also performed, therefore, as a consequence, the second moving body moves in the direction opposite to the first direction only by a distance of the movement distance in the first direction caused by the initial velocity subtracted from the movement distance of the second moving body during free motion according to the law of conservation of momentum due to the reaction force of the drive force that drives the first moving body in the first direction, and the movement distance of the second moving body becomes shorter. Especially, in the case the first moving body moves in the first direction accompanied by acceleration and deceleration, because the second moving body moves in the first direction during the deceleration of the first moving body, the moving distance in the opposite direction of the first direction of the second body that has received the reaction force of the drive force of the first moving body in the first direction can be further reduced. Accordingly, with the first drive method of the present invention, the strokes necessary for movement of the second body can be shortened without necessarily increasing the size of the second moving body. Especially in the case the first moving body performs an operation that includes stepping movement in the first direction, because the first moving body alternately repeats acceleration and deceleration in the first direction, the strokes in the first axis direction (the first direction and the direction opposite to the first direction) necessary for movement of the second moving body can be made the shortest.

According to a second aspect of the present invention, there is provided a second drive method of a moving body in which a first moving body that moves in at least a first axis direction and a second moving body that moves in an opposite direction of the first moving body due to a reaction force of a drive force in the first axis direction of the first moving body are driven wherein when the first moving body moves in a first direction out of two directions in the first axis direction, position setting of the second moving body is to be performed offset in the first direction.

With this method, because position setting of the second moving body is to be performed offset in the first direction when the first moving body moves in the first direction, in the case the first moving body and the second moving body follow the law of conservation of momentum, when the first moving body moves in the first direction, the second moving body moves in the direction opposite to the first direction receiving the reaction force of the drive force. However, the moving distance of the second moving body is canceled out by the offset amount, which makes the moving distance of the second moving body shorter by the offset amount. Accordingly, with the second drive method of the present invention, the strokes necessary for movement of the second moving body can be made shorter, without necessarily increasing the size of the second moving body.

According to a third aspect of the present invention, there is provided a first stage unit, comprising: a stage that moves at least in a first axis direction; a first drive unit that drives the stage; a counter mass that moves in an opposite direction of the stage due to an action of a reaction force of a drive force of the stage in the first axis direction by the first drive unit; a second drive unit that drives the counter mass in the first axis direction; and a control unit that controls the second drive unit and gives the counter mass an initial velocity in a first direction out of two directions in the first axis direction when the stage is moved in the first direction via the first drive unit.

In this case, "counter mass" is a mass body that moves according to the movement of the stage, and is arranged for the purpose of keeping the center of mass point in a dynamic system including the stage and the counter mass from moving and preventing an unbalanced load from being generated. The counter mass includes a stage which is different from the stage that holds the object subject to movement and is driven so that the total of momentum of both stages is maintained constant. Further, for example, the counter mass also includes a stator or the like of a drive unit that generates a drive force of a stage, working with a mover of the drive unit which integrally moves with the stage holding the object subject to movement, and is also configured to move freely by the reaction force of the drive force to the stage.

With this stage unit, because the control unit gives an initial velocity in the first direction to the counter mass when the stage moves in the first direction, when the stage moves in the first direction driven by the first drive unit, the counter mass moves in the direction opposite to the first direction receiving the reaction force of the drive force according to the law of conservation of momentum. However, at this point, a movement in the first direction due to the initial velocity is also performed, therefore, as a consequence, the counter mass moves in the direction opposite to the first direction only by a distance of the movement distance in the first direction caused by the initial velocity subtracted from the movement distance of the counter mass during free motion according to the law of conservation of momentum due to the reaction force of the drive force that drives the stage in the first direction, and the movement distance of the counter mass becomes shorter. Especially, in the case the stage moves in the first direction accompanied by acceleration and deceleration, because the counter mass moves in the first direction during the deceleration of the stage, the moving distance in the opposite direction of the first direction of the counter mass that has received the reaction force of the drive force of the stage in the first direction can be further reduced. Accordingly, with the first stage unit of the present invention, the strokes necessary for movement of the counter mass can be shortened without necessarily increasing the size of the counter mass. Especially in the case the stage performs an operation that includes stepping movement in the first direction, because the stage alternately repeats acceleration and deceleration in the first direction, the strokes in the first axis direction (the first direction and the direction opposite to the first direction) necessary for movement of the counter mass can be made the shortest.

According to a fourth aspect of the present invention, there is provided a second stage unit, comprising: a stage that moves at least in a first axis direction; a first drive unit that drives the stage; a counter mass that moves in an opposite direction of the stage due to an action of a reaction force of a drive force of the stage in the first axis direction by the first drive unit; a second drive unit that drives the counter mass in the first axis direction; and a control unit that controls the second drive unit and performs position setting of the counter mass offset in a first direction out of two directions in the first axis direction when the stage is moved in the first direction via the first drive unit.

With this unit, because the control unit performs position setting of the counter mass offset in the first direction when the stage moves in the first direction, in the case the stage and the counter mass follow the law of conservation of momentum, when the stage moves in the first direction, the counter mass moves in the direction opposite to the first direction receiving the reaction force of the drive force. However, the moving distance of the counter mass is canceled out by the offset amount, which makes the moving distance of the counter mass in the direction opposite to the first direction shorter by the offset amount, which allows the strokes of the counter mass to be set short.

According to a fifth aspect of the present invention, there is provided an exposure apparatus that transfers a pattern on an object, the apparatus comprising: a stage unit according to one of the first and second stage units on which the object is held as a drive unit of the object.

With this apparatus, because one of the first and second stage units of the present invention that can shorten the strokes necessary for movement of the counter mass without necessarily increasing the size of the counter mass is used as the drive unit of the object, the size of the entire apparatus can be reduced by the smaller stage unit and the influence of vibration due to the reaction force during the drive of the stage can almost be removed, which makes it possible improve the transfer accuracy (exposure accuracy) of the pattern by the improvement in position controllability of the stage, or consequently, the position controllability of the object.

According to a sixth aspect of the present invention, there is provided a third drive method in which a first moving body that moves in at least a first axis direction and a second moving body that supplies power usage to the first moving body and also moves in the same direction as the first moving body are driven wherein when the first moving body moves in a first direction in the first axis direction, an initial velocity in the first direction is given to the second moving body.

BEST MODE FOR CARRYING OUT THE INVENTION

An embodiment of the present invention will be described, referring to FIGS. 1 to 9B.

Figure 1:
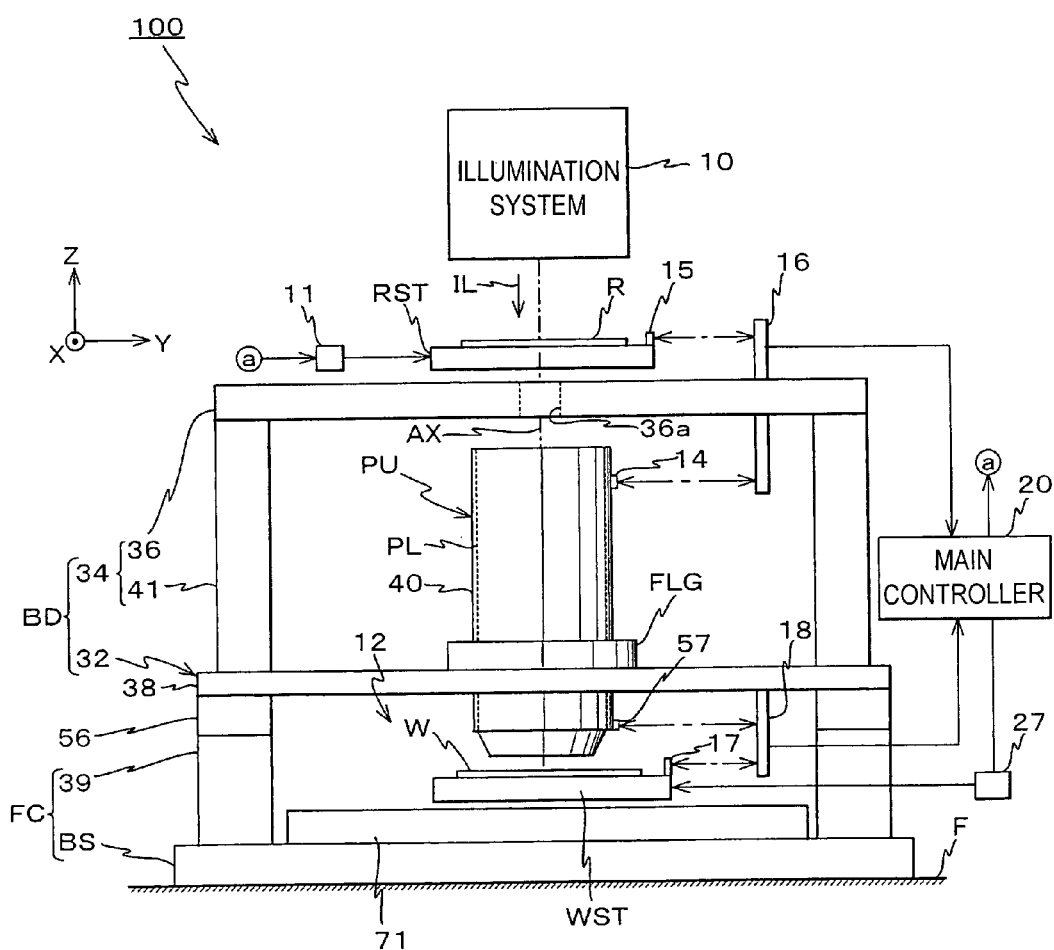
FIG. 1 is a schematic view of an exposure apparatus related to an embodiment of the present invention.

FIG. 1 shows the entire configuration of an exposure apparatus 100 related to the embodiment. Exposure apparatus 100 is a scanning exposure apparatus by a step-and-scan method, that is, the so-called scanning stepper. As it will be described later in the embodiment, a projection optical system PL is arranged, and in the description below, an optical axis direction AX of projection optical system PL will be described as the Z-axis direction, a direction within a plane orthogonal to the Z-axis direction in which a reticle R serving as a mask and a wafer W serving as an object are relatively scanned will be described as the Y-axis direction, and a direction orthogonal to both the Z-axis and the Y-axis will be described as the X-axis direction.

Exposure apparatus 100 is equipped with an illumination system 10 including a light source and an illumination optical system that illuminate reticle R serving as a mask with an illumination light (exposure light) IL serving as an energy beam, a reticle stage RST that holds reticle R, a projection unit PU, a wafer stage unit 12 that includes a wafer stage WST serving as a stage (and a first moving body) on which wafer W serving as an object is mounted, a body BY in which reticle stage RST and projection unit PU are built, a control system for the parts and the like.

Illumination system 10 illuminates a slit-shaped illumination area set by a reticle blind (not shown) with illumination light IL with a substantially uniform illumination. As illumination light IL, as an example, an ArF excimer laser beam (wavelength 193 nm) is used.

Reticle stage RST is supported by levitation above a reticle base 36 that makes up a top board of a second column 34 which will be described later by air bearings (not shown) arranged on the bottom surface of reticle base 36, for example, via a clearance of around several μm. On reticle stage RST, reticle R is fixed, for example, by vacuum suction (or electrostatic suction). Reticle stage RST, in this case, can be finely driven in an XY plane perpendicular to optical axis AX of projection optical system PL which will be described later two-dimensionally (in the X-axis direction, Y-axis direction, and a rotational direction around the Z-axis orthogonal to the XY plane (θz direction)) by a reticle stage drive section 11 which includes linear motors or the like. Reticle stage RST can also be driven above reticle base 36 in a predetermined scanning direction (in this case, the Y-axis direction which is the lateral direction in FIG. 1) at a designated scanning velocity. Reticle stage RST can have a coarse/fine movement structure that is well known.

In the case of the embodiment, measures are taken in order to reduce the influence as much as possible of vibration caused by the reaction force acting on stators of the linear motors when reticle stage RST is driven (especially during scanning). More specifically, the stators of the linear motors described above are each supported by a support member (reaction frame) (not shown) arranged separately from body BD as is disclosed in, for example, Kokai (Japanese Unexamined Patent Application Publication) No. 08-330224 and the corresponding U.S. Pat. No. 5,874,820 and the like, and the reaction force that acts on the stators during the drive of reticle stage RST is to be transmitted (released) to floor surface F of the clean room via the reaction frame. Besides such a method, a reaction canceling mechanism that uses the law of conservation of momentum as is disclosed in, for example, Kokai (Japanese Unexamined Patent Application Publication) No. 08-63231 and the corresponding U.S. Pat. No. 6,246,204 and the like, can also be employed as the reaction canceling mechanism. As long as the national laws in designated states (or elected states), on which this international application is applied, permit, the above disclosures of each of the publications and their corresponding U.S. patents are incorporated herein by reference.

The position of reticle stage RST within a stage movement plane is constantly detected by a reticle laser interferometer (hereinafter referred to as "reticle interferometer") 16 via a movable mirror 15 at a resolution of, for example, around 0.5 to 1 nm. In this case, position measurement is performed with a fixed mirror 14 fixed to the side surface of a barrel 40 that makes up projection unit PU serving as a reference. On reticle stage RST, a Y movable mirror that has a reflection surface orthogonal to the Y-axis direction and an X movable mirror that has a reflection surface orthogonal to the X-axis direction are actually arranged, and a reticle Y interferometer and a reticle X interferometer are also arranged corresponding to the movable mirrors, and furthermore, corresponding to the interferometers, a fixed mirror for position measurement in the X-axis direction and a fixed mirror for position measurement in the Y-axis direction are arranged, however, in FIG. 1 these are representatively indicated as movable mirror 15, reticle interferometer 16, and fixed mirror 14. The edge surface of reticle stage RST, for example, can also be mirror polished so as to form a reflection surface (corresponding to the reflection surface of movable mirror 15). Further, instead of the reflection surface extending in the X-axis direction used for detection the position of reticle stage RST in the scanning direction (in the embodiment, the Y-axis direction), at least one corner cube mirror (e.g. a retroreflector) can also be used. In the embodiment, one of the reticle Y interferometer and the reticle X interferometer, such as the reticle Y interferometer is a dual-axis interferometer that has two measurement axes, and based on the measurement values of reticle Y interferometer, the rotation of reticle stage RST in the θz direction around the Z-axis can be measured in addition to the Y position of reticle stage RST.

The measurement values of reticle interferometer 16 are sent to a main controller 20. Main controller 20 controls the drive of reticle stage RST via stage drive section 11, based on the measurement values of reticle interferometer 16.

Above reticle R, a pair of reticle alignment systems 13A and 13B (not shown in FIG. 1, refer to FIG. 5) consisting of TTR (Through The Reticle) alignment systems that use light of the exposure wavelength so as to simultaneously observe a pair of fiducial marks on wafer stage WST and a pair of reticle alignment marks on reticle R that correspond to the fiducial marks via projection optical system PL is arranged spaced a predetermined distance apart in the X-axis direction. As the pair of reticle alignment systems 13A and 13B, a system can be used that has a configuration similar to the one disclosed in, for example, Kokai (Japanese Unexamined Patent Application Publication) No. 07-176468 and the corresponding U.S. Pat. No. 5,646,413 and the like. As long as the national laws in designated states (or elected states), on which this international application is applied, permit, the above disclosures of the publication and the corresponding U.S. patent are incorporated herein by reference.

Projection unit PU is held by a part of body BD below reticle stage RST in FIG. 1. Body BD is equipped with a first column 32 arranged on frame caster FC installed on floor surface F of the clean room, and a second column 34 fixed on the first column 32.

Frame caster FC is equipped with a base plate BS laid horizontally on floor surface F, and a plurality of, e.g. three (or four), leg sections 39 (however, the leg section in the depth of the page surface of FIG. 1 is omitted in the drawings) fixed on base plate BS.

The first column 32 is equipped with a barrel platform (main frame) 38, which is supported substantially horizontally by a plurality of, e.g. three (or four), first vibration isolation mechanisms 56 fixed individually on the upper end of the plurality of leg sections 39 that constitutes frame caster FC.

In barrel platform 38, a circular opening (not shown) is formed substantially in the center, and in the circular opening, projection unit PU is inserted from above and is held via a flange FLG arranged on the outer circumferential section. On the upper surface of barrel platform 38, at positions surrounding projection unit PU, one end (the lower end) of a plurality of, e.g. three (or four), legs 41 (however, the leg in the depth of the page surface of FIG. 1 is omitted in the drawings) is fixed. The other end (the upper end) of these legs 41 is substantially flush on a horizontal surface, and on each of the upper end surface of legs 41, the lower surface of reticle base 36 described earlier is fixed. In the manner described above, the plurality of legs 41 horizontally supports reticle base 36. That is, the second column 34 is configured by reticle base 36 and legs 41 supporting reticle base 36. In reticle base 36, an opening 36a, which serves as a path for illumination light IL, is formed in the center.

Projection unit PU is configured by barrel 40 that has a cylindrical shape and has flange FLG arranged on the outer periphery in the vicinity of the lower end section, and projection optical system PL consisting of a plurality of optical elements held in barrel 40.

As projection optical system PL, for example, a dioptric system is used consisting of a plurality of lenses (lens elements) that share optical axis AX in the Z-axis direction. Projection optical system PL is, for example, a both-side telecentric dioptric system that has a predetermined projection magnification (such as one-quarter or one-fifth times) is used. Therefore, when illumination light IL from illumination system 10 illuminates the illumination area on reticle R, by illumination light IL that has passed through reticle R, a reduced image of the circuit pattern within the illumination area of reticle R (a partial reduced image of the circuit pattern) is formed on wafer W whose surface is coated with a resist (a photosensitive agent) via projection unit PU (projection optical system PL). Wafer W is, for example, a disc-shaped substrate such as a semiconductor (silicon or the like) or an SOI (Silicon Insulator), and a resist is coated on the substrate.

Wafer stage unit 12 is equipped with a stage base 71, which is supported substantially horizontally by a plurality of (e.g. three) second vibration isolation mechanisms (not shown) placed on base plate BS, wafer stage WST placed above the surface of stage base 71, a stage drive section 27 that drives parts such as wafer stage WST, and the like.

Figure 2:
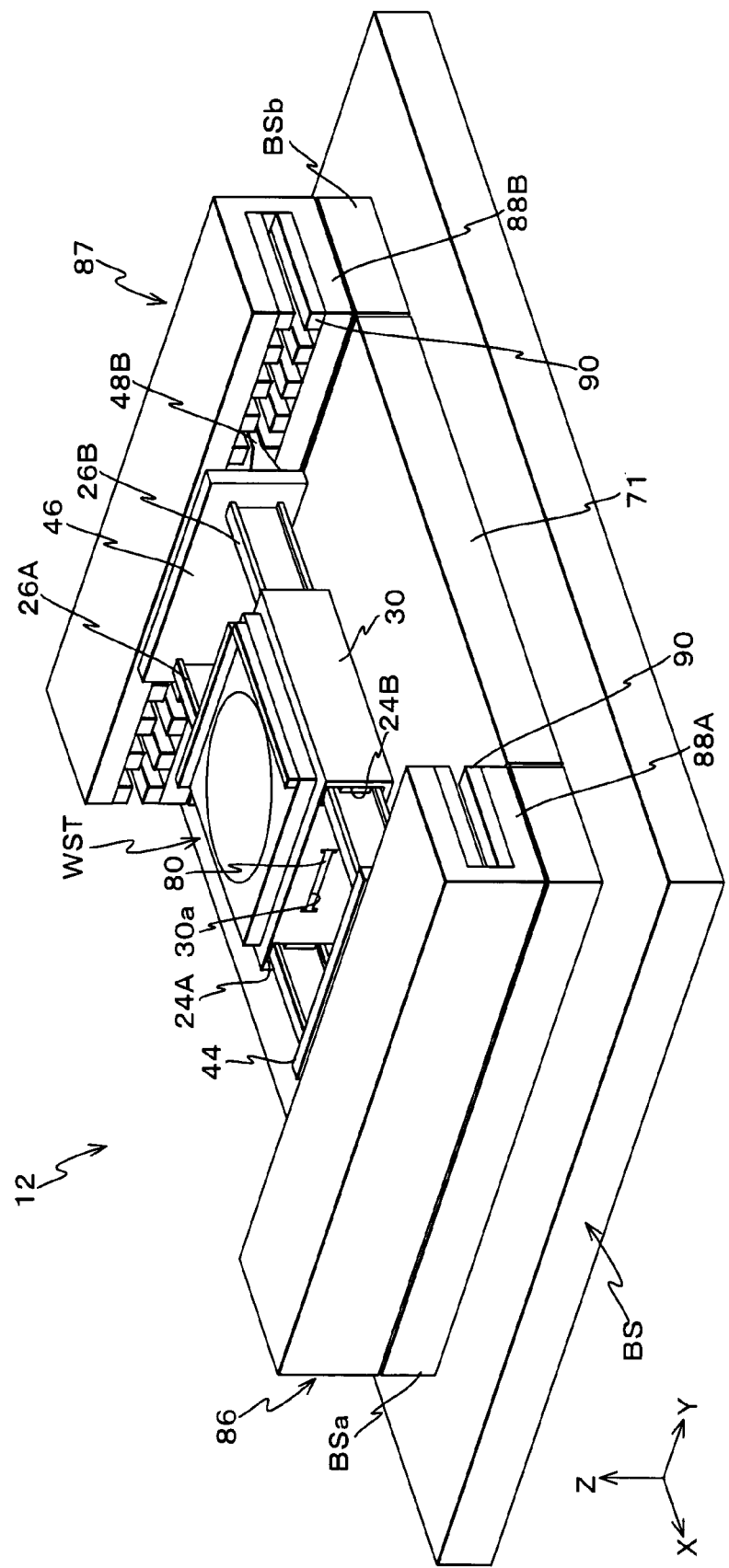
FIG. 2 is a perspective view of a wafer stage unit in FIG. 1.

As is obvious from FIG. 2 that shows a perspective view of wafer stage unit 12, base plate BS is composed of a rough flat-plate member on which protruded sections BSa and BSb that protrude upward and whose longitudinal direction is the Y-axis direction are integrally formed in the vicinity of both edges of base plate BS in the X-axis direction.

Stage base 71 is made of a flat-plate member, which is also called a platform, and is placed on an area between protruded sections BSa and BSb of base plate BS. The degree of flatness of the upper surface of stage base 71 is extremely high, and the upper surface serves as a guide surface when wafer stage WST moves.

Figure 3:
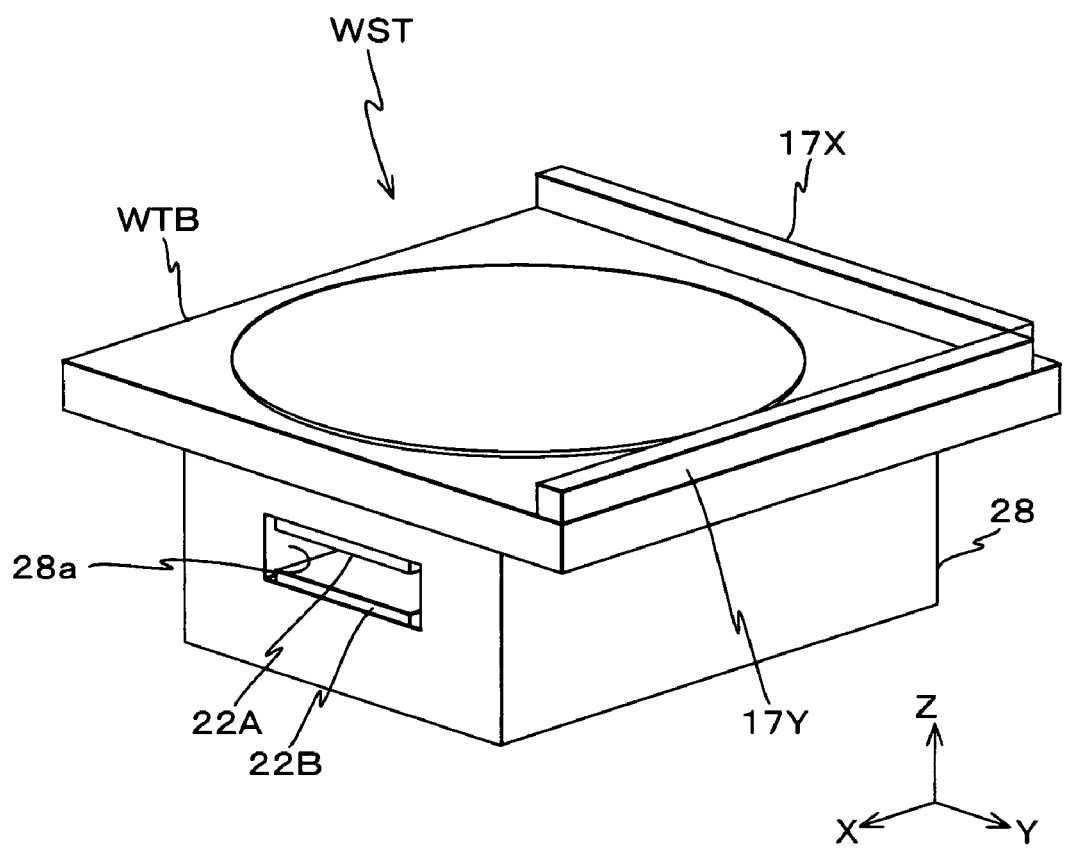
FIG. 3 is a perspective view of a wafer stage in FIG. 1.
Figure 5:
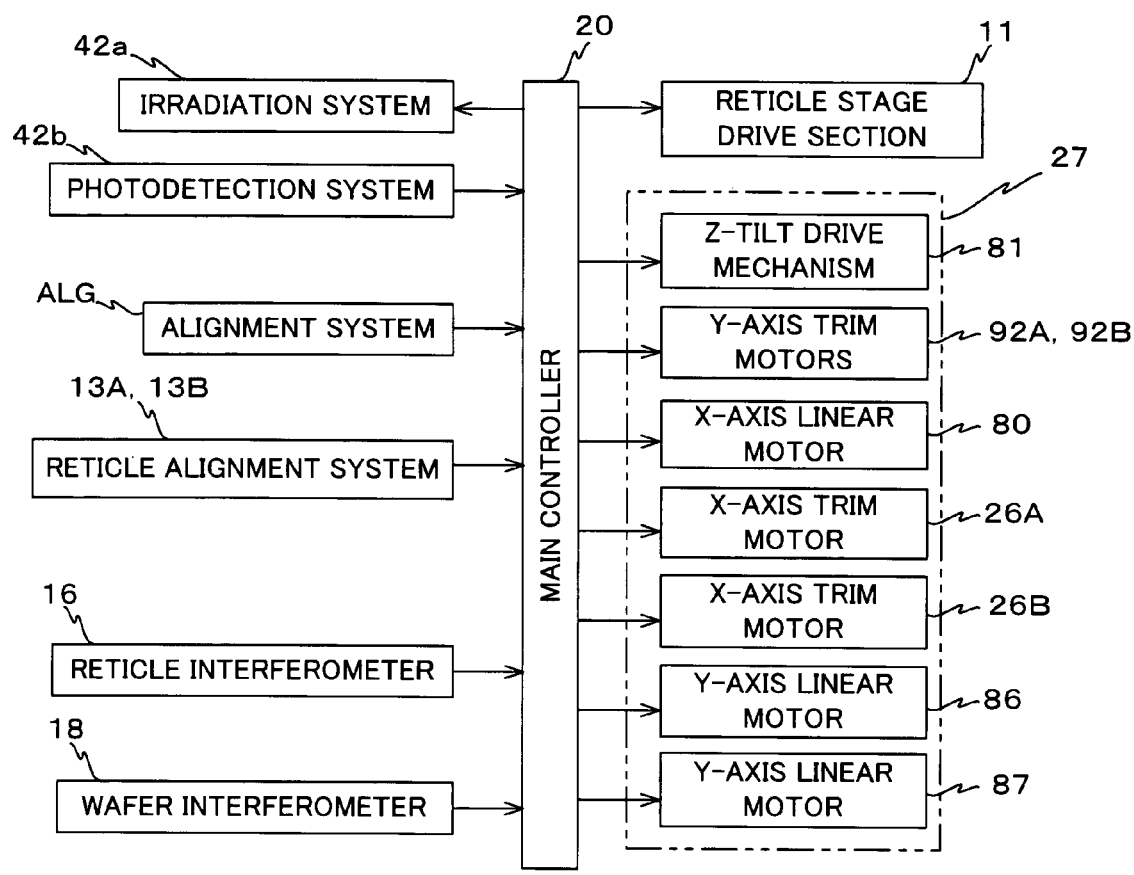
FIG. 5 is a block diagram that shows a configuration of a control system related to stage control.

As is shown in FIG. 3, wafer stage WST is equipped with a box-shaped wafer stage main body 28, and a wafer table WTB mounted on wafer stage main body 28 via a Z-tilt drive mechanism 81 (not shown in FIG. 3, refer to FIG. 5). Z-tilt drive mechanism 81 is actually configured including three actuators (e.g. voice coil motors or electromagnets) that support wafer table WTB on wafer stage main body 28 at three points, and finely drives wafer table WTB in the Z-axis direction, the θx direction (rotational direction around the X-axis), and the θy direction (rotational direction around the Y-axis), in directions of three degrees of freedom.

As is shown in FIG. 3, a rectangular shaped opening 28a that extends narrowly in the X-axis direction is formed in wafer stage main body 28. On the inner side of opening 28a on the vertical opposing surfaces, a pair of magnetic pole units, 22A and 22B, is respectively fixed. These magnetic pole units, 22A and 22B, have a plate shaped magnetic body member and a permanent magnet group consisting of a plurality of sets of a North-pole permanent magnet and a South-pole permanent magnet that are alternately placed at a predetermined spacing along the X-axis direction on the lower surface or the upper surface of the magnetic body member. In this case, in magnetic pole unit 22A and magnetic pole unit 22B, the permanent magnets that face each other are to have an opposite polarity. Accordingly, inside opening 28a, an alternating magnetic field is formed along the X-axis direction.

Figure 4:
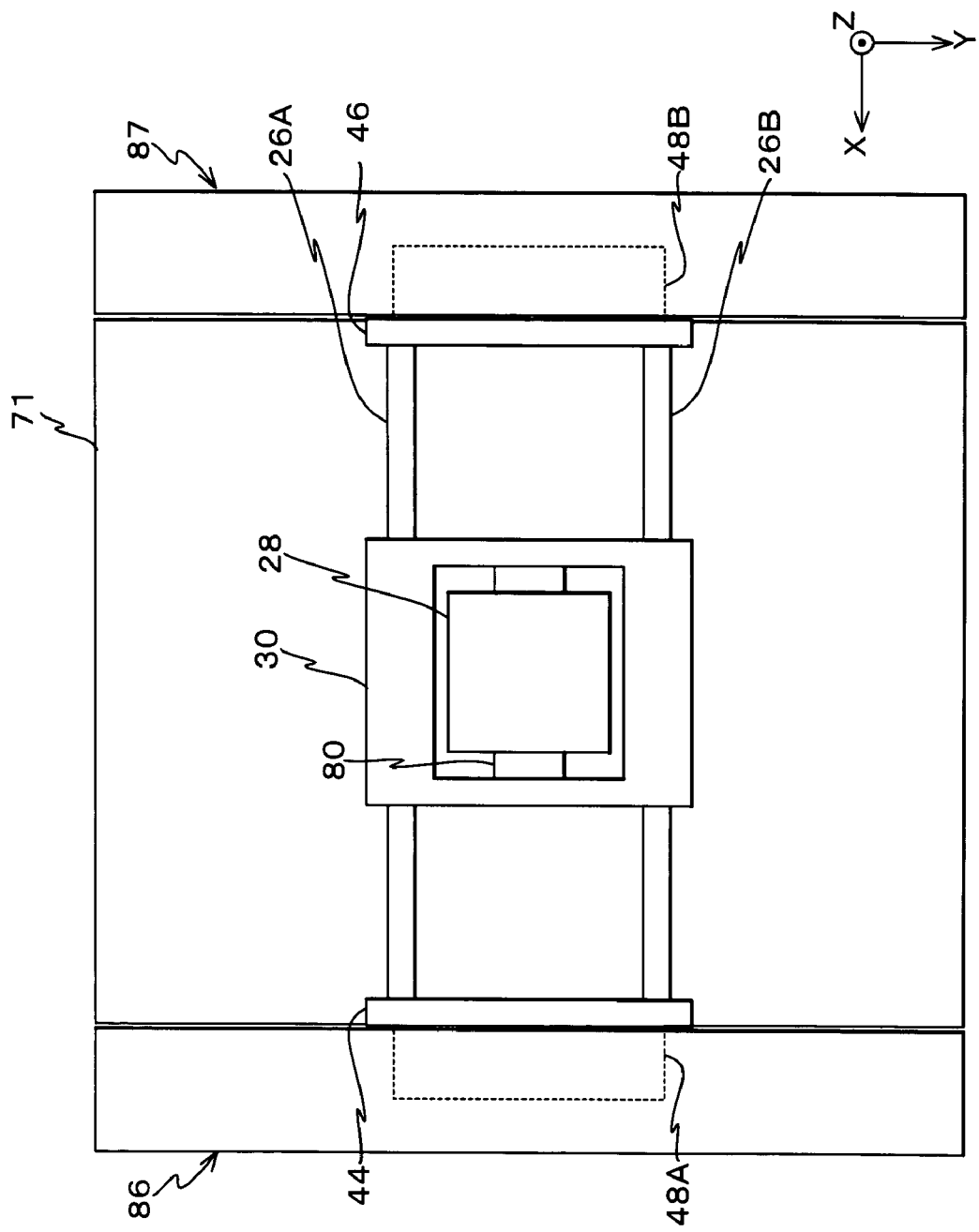
FIG. 4 is a planar view of the wafer stage unit with a wafer table detached from the wafer stage unit.

Wafer stage WST is attached so that in a state shown in FIG. 2 and FIG. 4, which is a planar view of wafer stage unit 12 in a state where wafer table WTB is detached from wafer stage WST shown in FIG. 2 and shows wafer stage main body 28 assembled inside a counter mass 30 serving as a second moving body that has a rectangular frame shape in a planar view (when viewed from above), relative movement in the X-axis direction can be performed with respect to counter mass 30. More specifically, on each of the side walls of counter mass 30 on the +X side and the −X side, an opening 30a of an H shape extending narrowly in the Y-axis direction is formed (however, the opening in the depth of the page surface of FIG. 2 is not shown). And an armature unit 80 installed between the side wall on the +X side and the side wall on the −X side of counter mass 30 is in a state inserted inside opening 28a of wafer stage main body 28. As is obvious from FIG. 4, wafer stage main body 28 (wafer stage WST) is movable in a predetermined range along armature unit 80 in the X-axis direction.

Armature unit 80 is fixed to counter mass 30 in a state where one end and the other end of armature unit 80 in the longitudinal direction are inserted inside opening 30a arranged in the side wall on the +X side and the side wall on the −X side of counter mass 30, respectively.

On the lower surface of wafer stage main body 28, a plurality of (e.g. four) static gas bearings (not shown) such as air bearings is arranged, and in the state shown in FIG. 2, wafer stage WST is supported in a non-contact manner via the bearings, via a predetermined clearance above the guide surface previously described.

In the embodiment, armature unit 80 and the pair of magnetic pole units 22A and 22B constitute a moving magnet type X-axis linear motor that drives wafer stage WST in the X-axis direction inside counter mass 30. Hereinafter, the X-axis linear motor will be appropriately referred to as an X-axis linear motor 80, using the same reference numeral as armature unit 80 serving as the stator. In the embodiment, X-axis linear motor 80 makes up a first drive unit that drives wafer stage WST in the X-axis direction.

As is shown in FIG. 2, on both sides in the Y-axis direction in counter mass 30, X-axis movers 24A and 24B that have magnetic pole units extending in the X-axis direction are integrally incorporated. In the space inside X-axis movers 24A and 24B, an alternating magnetic field is formed along the X-axis direction, and in the alternating magnetic field, X-axis stators 26A and 26B that extend in the X-axis direction consisting of armature units are inserted. One end of X-axis stators 26A and 26B in the longitudinal direction (the end on the +X side) is fixed to an edge surface on the −X side of a plate shaped slider 44 parallel to the YZ plane, respectively. Further, the other end of X-axis stators 26A and 26B in the longitudinal direction (the end on the −X side) is fixed to an edge surface on the +X side of a plate shaped slider 46 parallel to the YZ plane, respectively.

In X-axis stators 26A and 26B, a plurality of armature coils are arranged inside each of the stators at a predetermined spacing along the X-axis direction. In counter mass 30 in the sections facing the upper surface of X-axis stators 26A and 26B, static gas bearings (not shown) (e.g. air bearings) are arranged, and by the static gas bearings, counter mass 30 is supported in a non-contact manner with respect to X-axis stators 26A and 26B.

As is shown in FIG. 4, to the edge surface of slider 44 on the +X side and the edge surface of slider 46 on the −X side, Y-axis movers 48A and 48B (not shown in FIG. 2, refer to FIG. 4) that are equipped with a rectangular plate shaped armature coils parallel to the XY plane are fixed. These Y-axis movers 48A and 48B are inserted into the space inside Y-axis stators 86 and 87 which extend in the Y-axis direction and resemble the letter U roughly when viewed from the +Y direction, as is shown in FIG. 2. Y-axis stators 86 and 87 are supported by levitation via a predetermined clearance with respect to the upper surface of protruded sections BSa and BSb previously described, by static gas bearings (not shown) (e.g. air bearings) arranged on each of their lower surfaces. However, in this case, Y-axis stators 86 and 87 are kept from moving in the X-axis direction by stoppers (not shown) arranged in protruded sections BSa and BSb, therefore, Y-axis stators 86 and 87 can move only in the Y-axis direction. Further, although it is omitted in the drawings in FIG. 2, Y-axis trim motors 92A and 92B are arranged (refer to FIG. 5) that respectively drive Y-axis stators 86 and 87 in the Y-axis direction.

On each of the bottom surfaces of sliders 44 and 46, a plurality of air bearings are arranged, and in the state shown in FIG. 2, sliders 44 and 46 are supported via the plurality of air bearings in a non-contact manner by levitation above the upper surface of stage base 71 (the guide surface referred to earlier), via a clearance of around several μm.

On the +X side surface of one of the sliders, slider 44, vacuum preload static gas bearings (not shown) are arranged, and on the −X side surface of the other slider, slider 46, vacuum preload static gas bearings (not shown) are arranged. In this case, due to the balance between the static pressure of the pressurized gas that blows out from each of the static gas bearings and the vacuum preload force, and the balance between the static pressure and the vacuum preload force by both of the static gas bearings, the distance between sliders 44 and 46 and Y-axis stators 86 and 87 can be maintained constantly in a desired state.

Y-axis stators 86 and 87 are equipped with stator yokes 88A and 88B, respectively, that resemble the letter U in the XZ section, and a permanent magnet group 90 consisting of a plurality of sets of a North-pole permanent magnet and a South-pole permanent magnet that are alternately placed at a predetermined spacing along the Y-axis direction on the opposing surfaces (the upper and lower surfaces) on the inner side of stator yokes 88A and 88B. In this case, the permanent magnets that face each other are to have an opposite polarity. Accordingly, in stator yokes 88A and 88B in their inner space, an alternating magnetic field is formed along the Y-axis direction.

In the embodiment, X-axis stators 26A and 26B and X-axis movers 24A and 24B constitute X-axis trim motors composed of a pair of moving magnet type X-axis linear motors that drives counter mass 30 in the X-axis direction. Hereinafter, for the sake of convenience, each of the pair of the X-axis trim motors will be described as X-axis trim motors 26A and 26B, using the same reference numeral as X-axis stators 26A and 26B.

Further, Y-axis movers 48A and 48B and Y-axis stators 86 and 87 and constitute a pair of moving coil type Y-axis linear motors that drives the stage unit including wafer stage WST, counter mass 30, X-axis trim motors 26A and 26B, and sliders 44 and 46 in the Y-axis direction. Hereinafter, each of the pair of the Y-axis linear motors will be described as Y-axis linear motors 86 and 87, using the same reference numeral as Y-axis stators 86 and 87. Wafer stage WST can also be rotated in the θz direction by slightly changing the drive force in the Y-axis direction generated by Y-axis linear motors 86 and 87. The pair of the Y-axis linear motors configured can also be a moving magnet type.

In the embodiment, X-axis trim motors 26A and 26B make up a second drive unit that drives counter mass 30 in the X-axis direction, and Y-axis linear motors 86 and 87 make up a third drive unit that drives wafer stage WST along with counter mass 30 in the Y-axis direction.

In the embodiment, stage drive section 27 in FIG. 1 is configured including the first, second, and third drive units and each of the actuators in Z-tilt drive mechanism 81, and each motor and each actuator that constitute stage drive section 27 operates under the control of main controller 20 (refer to FIG. 5).

Instead of arranging static gas bearings on the +X side surface of slider 44 and the −X side surface of slider 46, a configuration can be employed where Y-axis linear motors 86 and 87 generate the drive force in the X-axis direction. In such a case, Y-axis linear motors 86 and 87 can constantly generate a force in the X-axis direction, so as to constantly maintain the distance between sliders 44 and 46 and stators 86 and 87 in a desired state.

On wafer table WTB, wafer W is fixed by vacuum suction (or electrostatic suction) via a wafer holder (not shown). Further, on wafer table WTB, a fiducial mark plate (not shown) is fixed in a state where the surface of the plate is flush with wafer W. On the surface of the fiducial mark plate, at least one pair of a first fiducial mark, a second alignment mark whose positional relation with respect to the first fiducial marks is known and is used for base line measurement of an off-axis alignment system and the like are formed.

The position of wafer table WTB (wafer stage WST) within the XY plane is detected at all times by a wafer laser interferometer (hereinafter referred to as 'wafer interferometer') 18 that irradiates a measurement beam on a movable mirror 17 (refer to FIG. 1) fixed on the upper section of wafer table WTB, at a resolution of, for example, around 0.5 to 1 nm. Wafer interferometer 18 is fixed to barrel platform 38 in a suspended state, and measures the positional information of the reflection surface of movable mirror 17 whose reference is a reflection surface of a fixed mirror 57 fixed to the side surface of barrel 40 that makes up projection unit PU, as the positional information of wafer stage WST.

On wafer table WTB, as is shown in FIG. 3, a Y movable mirror 17Y that has a reflection surface orthogonal to the scanning direction, which is the Y-axis direction, and an X movable mirror 17X that has a reflection surface orthogonal to the non-scanning direction, which is the X-axis direction, are actually provided, and corresponding to these movable mirrors, laser interferometers and fixed mirrors are also arranged for position measurement in the X-axis direction and position measurement in the Y-axis direction; however, such details are representatively shown as movable mirror 17, wafer interferometer 18, and fixed mirror 57 in FIG. 1. And, for example, the edge surface of wafer table WTB can be mirror polished so as to form a reflection surface (corresponding to the reflection surface of movable mirror 17). Further, the laser interferometer for position measurement in the X-axis direction and the laser interferometer for position measurement in the Y-axis direction are both multi-axis interferometers that have a plurality of measurement axes, and with these interferometers, other than the X and Y positions of wafer table WTB, rotation (yawing (rotation in the θz direction), pitching (rotation in the θx direction), and rolling (rotation in the θy direction) can also be measured. Accordingly, in the description below, wafer interferometer 18 is to measure the position of wafer table WTB in directions of five degrees of freedom, in the X, Y, θz, θy, and θx directions. Further, the multi-axis interferometers may detect positional information related to the optical axis AX direction (the Z-axis direction) of projection optical system PL, by irradiating a laser beam on a reflection surface (not shown) arranged in barrel platform 38 where projection unit PU is held, via a reflection surface arranged on wafer stage WST at an inclination of 45°.

Positional information (or velocity information) on wafer stage WST is sent to main controller 20, and based on the positional information (or velocity information) on wafer stage WST, main controller 20 controls the position of wafer stage WST within the XY plane via X-axis linear motor 80, and Y-axis linear motors 86 and 87 that constitute stage drive section 24 referred to above.

In exposure apparatus 100 of the embodiment, although it is omitted in FIG. 1, a multiple point focal position detection system based on an oblique method that consists of an irradiation system 42a and a photodetection system 42b similar to the one disclosed in, for example, Kokai (Japanese Patent Unexamined Application Publication) No. 6-283403 and the corresponding U.S. Pat. No. 5,448,332 or the like is arranged (refer to FIG. 5). As long as the national laws in designated states or elected states, to which this international application is applied, permit, the disclosures of the above publication and the corresponding U.S. patent are fully incorporated herein by reference.

In exposure apparatus 100 of the embodiment, although it is omitted similarly in FIG. 1, in the vicinity of projection unit PU, an off-axis alignment system ALG is arranged (refer to FIG. 5). As this alignment system ALG, for example, a sensor of an FIA (Field Image Alignment) system based on an image-processing method is used. This sensor irradiates a broadband detection beam that does not expose the resist on the wafer on a target mark, picks up the image of the target mark formed on the photodetection surface by the reflection light from the target mark and an index with a pick-up device (such as a CCD), and outputs the imaging signals. Off-axis alignment system ALG supplies positional information of marks that use the index center as a reference to main controller 20. And, based on the information that has been supplied and the measurement values of wafer interferometer 18, main controller 20 measures the mark subject to detection, or to be more specific, measures the positional information of the second fiducial mark on the fiducial mark plate or the alignment marks on the wafer on the stage coordinate system set by the measurement axes of wafer interferometer 18.

FIG. 5 shows a block diagram of a control system (partially omitted) related to stage control in exposure apparatus 100 of the embodiment. The control system in FIG. 5 is configured including a so-called microcomputer (or workstation) made up of a CPU (Central Processing Unit), ROM (Read Only Memory), RAM (Random Access Memory), and the like, and is mainly composed of main controller 20, which serves as a control unit that controls the overall operation of the entire apparatus.

Next, a series of processing operations in the exposure process performed on a wafer in one lot (e.g. 25 or 50 wafers in one lot) performed by the exposure apparatus of the embodiment will be described according to a flow chart shown in FIG. 6 that shows a processing algorithm of a CPU inside main controller 20, and also referring to other drawings as appropriate.

Figure 7:
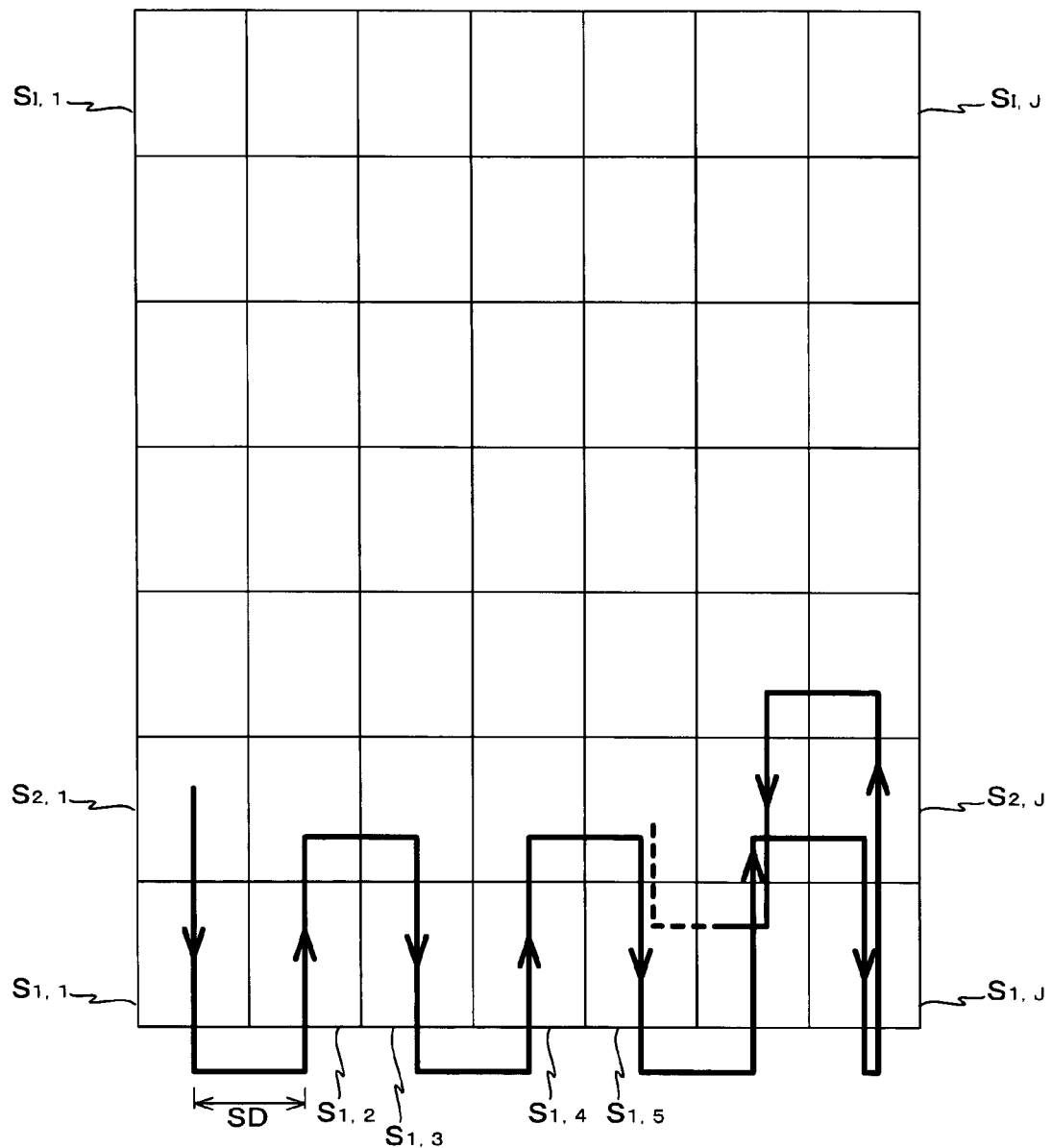
FIG. 7 is a view that shows an example of an arrangement of a shot area on a wafer along with a locus of the center of an irradiation area of an illumination light on the wafer, during an exposure operation by a step-and-scan method.

In the description below, the case will be described where the pattern of reticle R is transferred onto row I, column J of wafer W (I and J are both odd numbers) as is shown in FIG. 7. The locus indicated by a solid line shown in FIG. 7 shows the locus of the center of an irradiation area of an illumination light on the wafer, which is conjugate with the illumination area previously described, during the exposure operations by the step-and-scan method. The irradiation area of the illumination light on the wafer is actually fixed and wafer W (wafer stage WST) is supposed to move in the direction opposite to the locus indicated by the solid line, however, in FIG. 7, in order to make the description on exposure sequence or the like comprehensible, expressions are used as if the irradiation area of the illumination light on the wafer moves instead.

Figure 6:
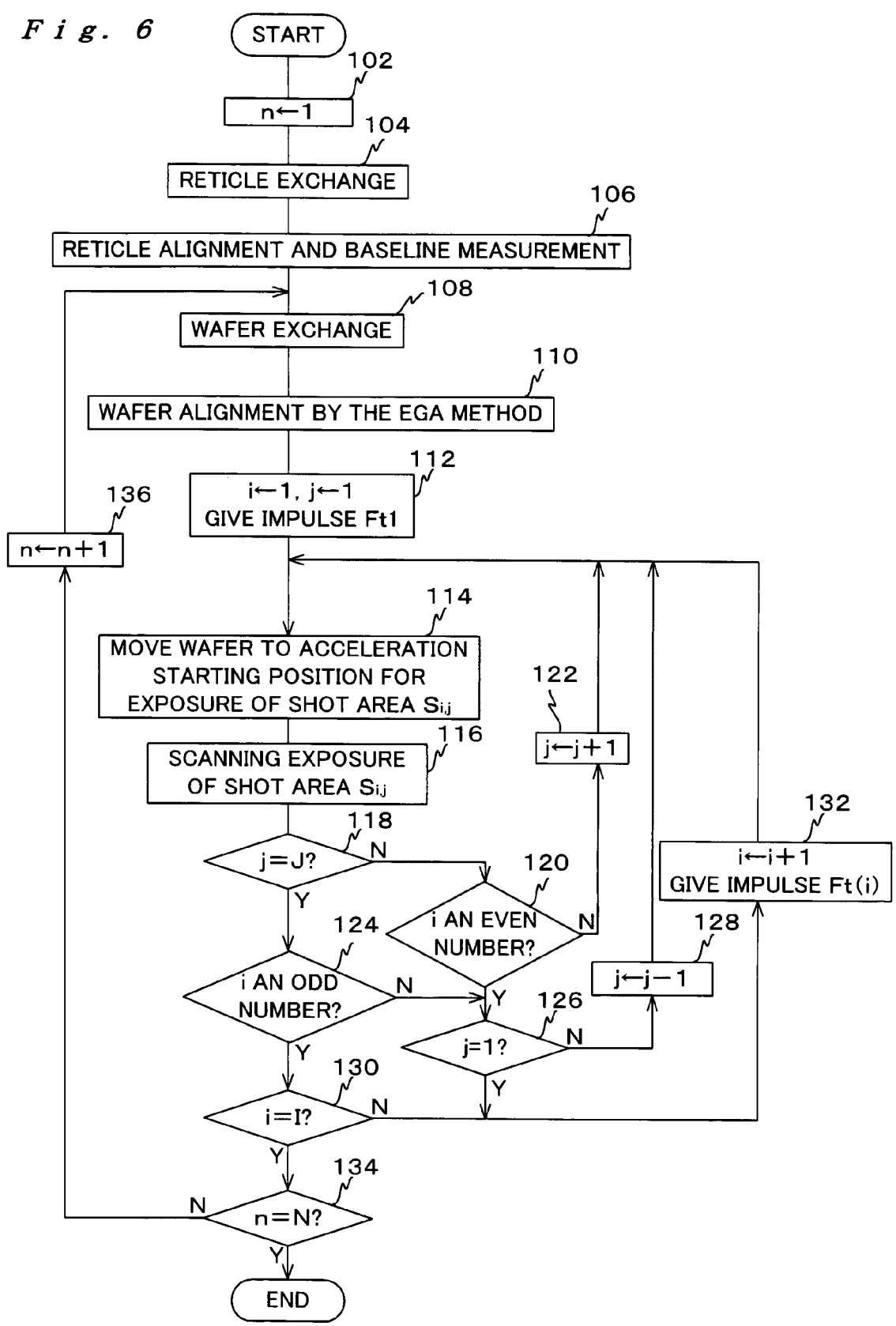
FIG. 6 is a flow chart that shows a processing algorithm within a main controller 20 on a series of processing in the exposure process with respect to wafers in one lot.

First of all, in step 102 of FIG. 6, a counter value n of a counter that shows the number of the wafer in the lot subject to exposure is initialized to "1" (n←1).

In the next step, step 104, the reticle that has been used mounted on reticle stage RST is exchanged to reticle R used in the next exposure, using a reticle loader (not shown).

In the next step, step 106, reticle alignment and baseline measurement of alignment system ALG is executed, as in a typical scanning stepper.

In the next step, step 108, the wafer that has been used mounted on wafer stage WST is exchanged to wafer W used in the next exposure that has not yet been exposed, using a wafer loader (not shown).

In the next step, step 110, wafer alignment using alignment system ALG, such as EGA (Enhanced Global Alignment) disclosed in, for example, Kokai (Japanese Unexamined Patent Application Publication) No. 61-44429, and the corresponding U.S. Pat. No. 4,780,617, and the like is executed on wafer W loaded on wafer stage WST, and arrangement coordinates of each of the shot areas on wafer W, or in other words, the position coordinates of the center of each of the shot areas on the wafer stage coordinate system is computed and stored in a memory such as the RAM (not shown). As long as the national laws in designated states (or elected states), to which this international application is applied, permit, the above disclosures of the publication and the U.S. patent are incorporated herein by reference.

In the next step, step 112, a counter value i of a counter that shows the row number of a shot area on wafer W and a counter value j of a counter that shows the column number is initialized to "1" (i←1, j←1), and an impulse Ft1 is also given to counter mass 30 via X-trim motors 26A and 26B.

When the mass of wafer stage WST is expressed as m, the mass of counter mass 30 is expressed as M, the distance (that is, the stepping distance during a stepping movement operation which will be described later) between the center of adjacent shot areas in the stepping direction (the X-axis direction) is expressed as SD (refer to FIG. 7), and the time from the point where scanning of wafer stage WST has been completed for exposure of a shot area until the point where scanning of wafer stage WST has been completed for exposure of the next shot area adjacent in the X-axis direction is expressed as T, then the impulse is determined as Ft1=(M+m)*SD/T.

By the action of impulse Ft1, counter mass 30 is given an initial velocity $v_0$=(M+m)*SD/T/M. In the case of the embodiment, since it is all right to say that the momentum of the system including wafer stage WST and counter mass 30 is substantially conserved, hereinafter, counter mass 30 is to have a momentum larger by $v_0$*M=Ft1 than the momentum caused by an external force. The direction of the initial velocity is the stepping direction (the +X direction, in the case of FIG. 7 just before exposure of shot area $S_{1,1}$ begins) of wafer W (wafer stage WST).

In the next step, step 114, based on the results of wafer alignment and measurement results of the baseline referred to earlier in step 110, main controller 20 moves wafer stage WST (wafer W) to the acceleration starting position for exposure of shot area $S_{i,j}$ (in this case, shot area $S_{1,1}$), while monitoring the measurement values of wafer interferometer 18.

When the movement of wafer stage WST (wafer W) to the acceleration staring position above is completed, then, in step 116, scanning exposure of shot area $S_{i,j}$ is performed according to the flow of a. to d. described below.

a. Acceleration is started for relative scanning of reticle stage RST and wafer stage WST in the Y-axis direction. In the embodiment, as is obvious from FIG. 7, the scanning direction of wafer stage WST is set so that the direction is the −Y direction when a shot area of an odd number row and an odd number column and a shot area of an even number row and an even number column are exposed, and the direction is the +Y direction when a shot area of an odd number row and an even number column and a shot area of an even number row and an odd number column are exposed. The scanning direction of reticle stage RST is constantly in the direction opposite to wafer stage WST, and the +Y direction and the −Y direction is alternately set as the scanning direction for each shot area.

b. Then, when a predetermined acceleration time (expressed as T1) passes after the acceleration above starts, both stages RST and WST substantially reach their target scanning velocities, and then when a settling time (expressed as T2) further passes, reticle stage RST and wafer stage WST reach a constant velocity synchronous state, illumination light IL (ultraviolet pulse light) from illumination system 10 begins to illuminate the pattern area of reticle R, and scanning exposure begins.

c. Then, different areas in the pattern area of reticle R are sequentially illuminated by illumination light IL, and when a predetermined exposure time (expressed as T3) passes from the starting of exposure described above, illumination on the entire pattern area is completed. This completes scanning exposure of shot area $S_{i,j}$ (in this case, shot area $S_{1,1}$) on wafer W, and the pattern of reticle R is reduced and transferred onto shot area $S_{i,j}$ (in this case, shot area $S_{1,1}$) on wafer W via projection optical system PL.

d. After reticle stage RST and wafer stage WST perform overscan while maintaining the same velocity as when scanning exposure is performed during a predetermined constant velocity overscan time (expressed as T4=T2) from the point where scanning exposure of shot area $S_{i,j}$ described above has been completed, reticle stage RST and wafer stage WST start deceleration, and at the point when a deceleration time (T5=T1) has passed from the beginning of deceleration, both stages RST and WST come to a stop. Accordingly, the relative scanning of both stages RST and WST for exposure of shot area $S_{i,j}$ (in this case, shot area $S_{1,1}$) on wafer W is completed.

That is, in the embodiment, during scanning time $T_{scan}$=2×T1+2×T2+T3, reticle stage RST and wafer stage WST are relatively scanned in the opposite directions in the Y-axis direction.

During the scanning exposure described above, because exposure needs to be performed in a state where the illumination area on wafer W coincides with the image-forming plane of projection optical system PL as much as possible, main controller 20 executes auto focus and auto leveling based on the output of the multiple point focal position detection system (42a, 42b) previously described.

When scanning exposure to shot area $S_{i,j}$ (in this case, shot area $S_{1,1}$) on wafer W in step 116 is completed in the manner described above, the procedure then moves on to step 118 where a judgment is made of whether or not counter value j equals J. In this case, since j=1, the judgment here is negative; therefore the procedure moves to step 120.

In step 120, a judgment is made of whether counter value is an even number or not. In this case, since i=1 and is an odd number, the judgment here is negative; therefore the procedure moves to step 122 where counter value j is incremented by 1 (j←j+1). Then, the procedure returns to step 114.

In step 114, wafer stage WST (wafer W) is moved to the acceleration starting position for exposure of shot area $S_{i,j}$ (in this case, shot area $S_{1,2}$) in the manner described above. More specifically, in this step, wafer stage WST is moved by stepping distance SD in a stepping direction determined in advance from a scanning completing position when exposing the preceding shot area. In the embodiment, as is obvious from FIG. 7, between the shot areas of the even number rows, the stepping direction is set in the +X direction, and between the shot areas of the odd number rows, the stepping direction is set in the −X direction.

When the movement of wafer stage WST (wafer W) to the acceleration starting position described above is completed, that is, when the stepping is completed, in step 116, scanning exposure is performed on shot area $S_{i,j}$ (in this case, shot area $S_{1,2}$). In the case of the embodiment, since the so-called alternate scanning is employed, the movement direction of reticle stage RST and wafer stage WST is reversed from the exposure of the preceding shot area.

Hereinafter, a loop processing of steps 118→120→122→114→116 are repeated, and the stepping operation of wafer stage WST and the scanning operation with respect to the shot areas on the wafer are alternately repeatedly performed.

Accordingly, scanning exposure with respect to shot areas $S_{1,3}, S_{1,4}, \ldots S_{1,J}$ on wafer W is performed.

Figure 8:
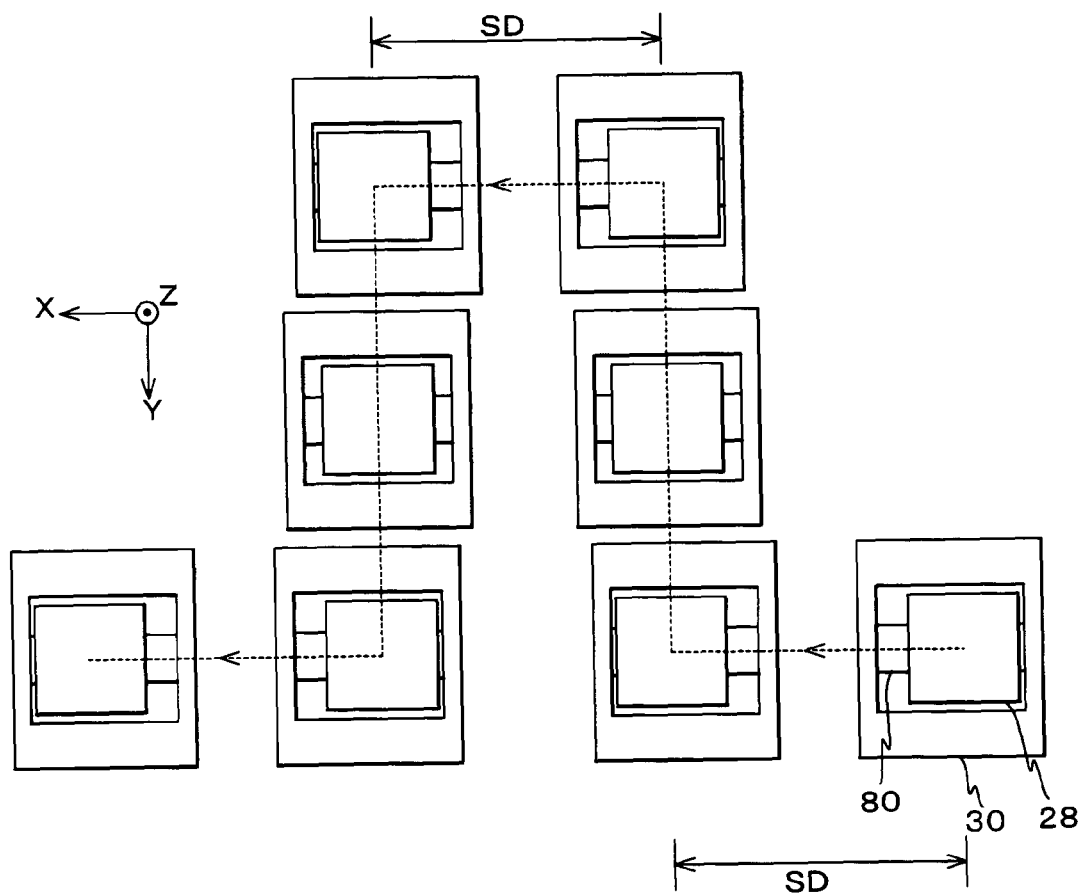
FIG. 8 is a view that models a state of a transition state of a wafer stage main body (wafer stage) and a counter mass from the point where scanning of both stages for exposure of shot area $S_{1,2}$ in FIG. 7 has been completed until the point where scanning of both stages for exposure of shot area $S_{1,J}$ begins.

FIG. 8 shows a transition state of wafer stage main body 28 (wafer stage WST) and counter mass 30 from the point where scanning of both stages RST and WST for exposure of shot area $S_{1,2}$ in FIG. 7 has been completed until the point where scanning of both stages RST and WST for exposure of shot area $S_{1,5}$ begins, modeled along a dotted arrow.

Figure 9A:
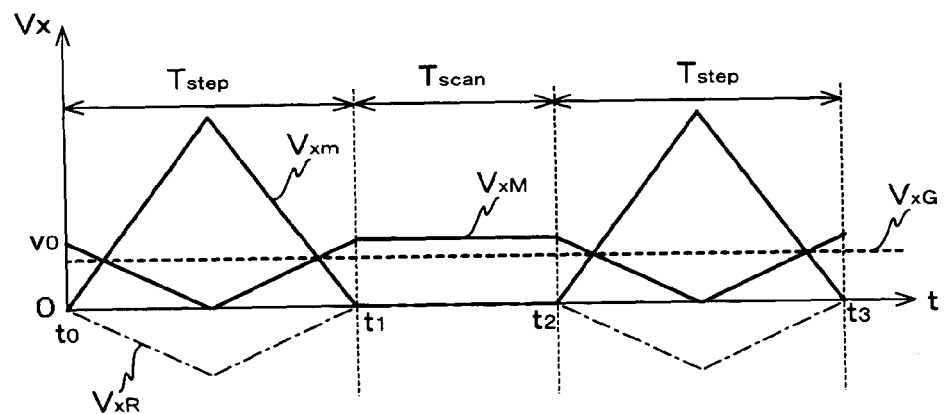
FIG. 9A is view corresponding to FIG. 8 that shows a temporal change curve of velocity of the wafer stage and the counter mass in the X-axis direction.
Figure 9B:
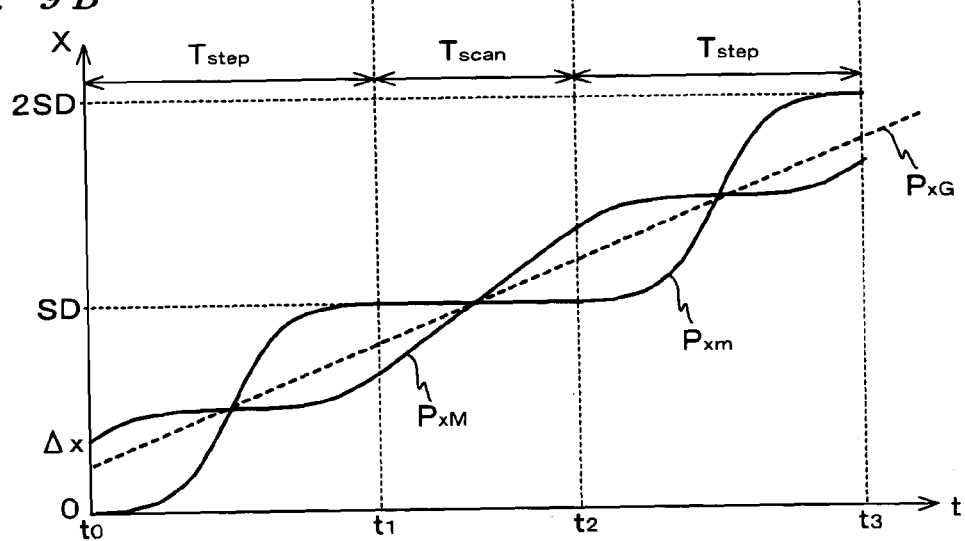
FIG. 9B is view corresponding to FIG. 8 that shows a temporal change curve of position of the wafer stage and the counter mass in the X-axis direction.

FIG. 9A shows a temporal change curve of the velocity of wafer stage WST and counter mass 30 in the X-axis direction, whereas FIG. 9B shows a temporal change curve of the position of wafer stage WST and counter mass 30 in the X-axis direction that corresponds to FIG. 9A.

In FIG. 9A, reference mark $V_{xm}$ shows the temporal change curve of the velocity of wafer stage WST in the X-axis direction, reference mark $V_{xM}$ shows the temporal change curve of the velocity of counter mass 30 in the X-axis direction, and reference mark $V_{xG}$ shows the temporal change curve of the velocity of center of mass of the system including wafer stage WST and counter mass 30. FIG. 9A also shows a temporal change curve $V_{xR}$ of the velocity of counter mass 30 in the X-axis direction in the case when only the reaction force of the drive force of wafer stage WST in the X-axis direction acts on counter mass 30.

In FIG. 9B, reference mark $P_{xm}$ shows the temporal change curve of the position of wafer stage WST in the X-axis direction, reference mark $P_{xM}$ shows the temporal change curve of the position of counter mass 30 in the X-axis direction, and reference mark $P_{xG}$ shows the temporal change curve of the position of center of mass of the system including wafer stage WST and counter mass 30. In FIG. 9B, 0 is the position of wafer stage main body 28 (the position of wafer stage WST) shown on the right hand end in FIG. 8.

As it can be seen when totally viewing FIGS. 8, 9A, and 9B, while wafer stage main body 28 (and wafer stage WST) performs a motion (time $T_{step}+T_{scan}$), which is one set of a repetition motion consisting of a stepping operation (step movement operation) and the scanning operation, such as for example, during time $t_0$ and time $t_2$ or during time $t_1$ and time $t_3$ in FIG. 9B, counter mass 30 relatively moves back and forth once in predetermined strokes 2Δx in the X-axis direction with respect to wafer stage WST.

Further, as is obvious when comparing curve $V_{xM}$ and curve $V_{xR}$ in FIG. 9A, the velocity of counter mass 30 in the X-axis direction (+X direction) (expressed as $v_{xM}$) is constantly larger than velocity $V_{xR}$ (the velocity of counter mass 30 in the X-axis direction in the case when only the reaction force of the drive force of wafer stage WST in the X-axis direction acts on counter mass 30) corresponding to temporal change curve $V_{xR}$ by initial velocity $v_0$. Accordingly, as is shown in temporal change curve $V_{xG}$ (straight line $V_{xG}$), the center of mass of the system including wafer stage WST and counter mass 30 performs a constant velocity motion at a constant velocity. More specifically, in the embodiment, initial velocity $v_0$ is an initial velocity that makes the center of mass of the system perform a constant velocity motion, and initial velocity $v_0$ is decided to the value described earlier based on mass m of wafer stage WST and mass M of counter mass 30. And, impulse Ft1 described earlier is set so as to give initial velocity $v_0$ to counter mass 30.

At time $t_0$, wafer stage WST is at the 0 point, and at this point, counter mass 30 is at a point on Δx. It is obvious that difference Δx between wafer stage WST and counter mass 30 is due to the fact that initial velocity $v_0$ was given to counter mass 30 prior to time $t_0$. Accordingly, in the case the position of counter mass 30 is to be set offset by Δx in the X-axis direction (in this case, the +X direction) with respect to wafer stage WST at time $t_0$ (or the point where stepping of wafer stage WST in the X-axis direction begins), the state transition shown in FIGS. 9A and 9B of wafer stage WST, counter mass 30, and the center of mass of the system can be performed by giving counter mass 30 initial velocity $v_0$ at time $t_0$ (or the point where stepping of wafer stage WST in the X-axis direction begins). In other words, it can also be said that each temporal change curve in FIGS. 9A and 9B is obtained when initial velocity $v_0$ is given to counter mass 30 simultaneously with the position setting of counter mass 30, which is offset by Δx in the X-axis direction with respect to wafer stage WST at the point when stepping of wafer stage WST in the X-axis direction begins.

Referring back to describing the flow chart in FIG. 6, when scanning exposure of shot area $S_{1,j}$ on wafer W is completed in the manner described above, the judgment in step 118 is affirmed, and the procedure then moves step 124 where a judgment is made of whether counter value i is an odd number or not. In this case, because counter value i=1, the judgment in step 124 is affirmed, and the procedure then moves to step 130.

In step 130, a judgment is made of whether counter value i is I or not. In this case, because counter value i=1, the judgment is denied, and the procedure moves to step 132 where counter value i is incremented by 1 (i←i+1) and impulse Ft(i) is given to counter mass 30 via X-axis trim motors 26A and 26B.

In this case, impulse Ft(i) is an impulse for giving counter mass 30 initial velocity $v_0$ in the opposite direction (in this case (when i=2), the −X direction) to the velocity so far, and Ft(i)=$(-1)^{i-1}$*2*Ft1=$(-1)^{i-1}$*2*(M+m)*SD/T. In this case, since i=2, the following impulse is given to counter mass 30;

$$Ft1 + Ft(i) = Ft1 + Ft(2)$$
$$= (M+m)*SD/T - 2*(M+m)*SD/T$$
$$= -(M+m)*SD/T,$$

accordingly, −(M+m)*SD/T/M=−$v_0$ is given to counter mass 30 as the initial velocity. Hereinafter, counter mass 30 is to have a momentum larger by −$v_0$*M=Ft1+Ft(2) when compared with the momentum caused by the action of an external force.

In the next step, step 114, wafer stage WST (wafer W) is moved to the acceleration starting position for exposure of shot area $S_{1,j}$ (in this case, shot area $S_{2,J}$). In this step, wafer stage WST is moved in the +Y direction by a predetermined distance (substantially coincides with the scanning direction length of the shot area) from the position where scanning has ended when exposure of the preceding shot area was performed.

When movement of wafer stage WST (wafer W) to the acceleration starting position described above, or in other words, the stepping, is completed, in step 116, scanning exposure of shot area $S_{1,j}$ (in this case, shot area $S_{2,J}$) is performed.

Next, in step 118, the judgment is made of whether or not counter value j equals J; however, since j=J, the judgment here is affirmed and the procedure moves to step 124 where the judgment is made of whether counter value i is an odd number or not. In this case, because counter value i=2, the judgment in step 124 is denied, and the procedure then moves to step 126 where the judgment is made of whether or not counter value j equals 1. In this case, since j=J, the judgment here is denied and the procedure the moves to step 128.

In step 128, counter value j is decremented by 1 (j←j−1), then, the procedure returns to step 114. In step 114, wafer stage WST (wafer W) is moved to the acceleration starting position for exposure of shot area $S_{i,j}$ (in this case, shot area $S_{2,J-1}$). In this step, wafer stage WST is moved in the −X direction by distance SD from the position where scanning has ended when exposure of the preceding shot area was performed.

When movement of wafer stage WST (wafer W) to the acceleration starting position described above, or in other words, the stepping, is completed, in step 116, scanning exposure of shot area $S_{i,j}$ (in this case, shot area $S_{2,J-1}$) is performed.

Next, in step 118, the judgment is made of whether or not counter value j equals J; however, since j=J−1, the judgment here is denied and the procedure moves to step 120 where the judgment is made of whether counter value i is an even number or not. In this case, because counter value i=2, the judgment in step 124 is affirmed, and the procedure then moves to step 126 where the judgment is made of whether or not counter value j equals 1. In this case, since j=J−1, the judgment here is denied and the procedure the moves to step 128. Hereinafter, a loop processing of steps 114→116→118→120→126→128 are repeated, and the stepping operation of wafer stage WST and the scanning operation with respect to the shot areas on the wafer are alternately repeatedly performed.

Accordingly, scanning exposure with respect to shot areas $S_{2,J-2}, S_{2,J-3}, \ldots S_{2,1}$ on wafer W is performed. Also when scanning exposure is performed with respect to shot areas in the second row on wafer W, the center of mass of wafer stage WST, counter mass 30, and the system including wafer stage WST and counter mass 30 moves in the X-axis direction, in the opposite direction, according to the temporal change of the velocity and the temporal change curve of the position similar to FIGS. 9A and 9B.

When scanning exposure with respect to shot area $S_{2,1}$ on wafer W is completed in the manner described above, the judgment in step 126 is affirmed, and the procedure then moves to step 132 where counter value i is incremented by 1 (i←i+1) and impulse Ft(i) is given to counter mass 30 via X-axis trim motors 26A and 26B.

In this case, since i=3, the following impulse is given to counter mass 30;

$$Ft1 + Ft(2) + Ft(3) = -(M+m)*SD/T + 2*(M+m)*SD/T$$
$$= (M+m)*SD/T,$$

accordingly, (M+m)*SD/T/M=−$v_0$ is given to counter mass 30 as the initial velocity. Hereinafter, counter mass 30 is to have a momentum larger by $v_0$*M=Ft1+Ft(2)+Ft(3) when compared with the momentum caused by the action of an external force.

As a result of giving impulse Ft(i) to counter mass 30 in step 132, an impulse FT expressed as in the following equation is given to counter mass 30.

[equation 1]

$$FT = Ft1 + \sum_{n=2}^{i} Ft(n) \tag{1}$$

Hereinafter, the processing from step 114 and onward is repeatedly performed until the judgment in step 130 is affirmed, and accordingly, exposure by the step-and-scan method is sequentially performed on shot areas $S_{3,1}, S_{3,2}, \ldots S_{3,J}$ in the third row on wafer W, shot areas $S_{4,1}, S_{4,2}, \ldots S_{4,J}$ in the fourth row on wafer W, shot areas $S_{5,1}, S_{5,2}, \ldots S_{5,j}$ in the fifth row on wafer W, . . . , and shot areas $S_{I,1}, S_{I,2}, \ldots S_{I,j}$ in the $I^{th}$ row on wafer W.

When scanning exposure of the last shot area $S_{I,J}$ on wafer W is completed in the manner described above, and the pattern of reticle R is transferred onto each of the I×J shot areas on wafer W, the judgment in step 130 is affirmed, and the procedure moves to step 134.

In step 134, a judgment is made of whether or not exposure of all the wafers in the lot has been completed, by judging whether counter value n of the counter previously described equals N (N is the total number of wafers in one lot). And, in the case the judgment is denied, the procedure then moves to step 136 where counter value n is incremented by 1 (n←n+1), and then the procedure returns to step 108.

Hereinafter, the processing from step 108 and onward is repeatedly performed until the judgment in step 134 is affirmed. Accordingly, the series of exposure processing is sequentially performed on the second wafer and the following wafers in the lot.

And, when the series of exposure processing is completed on the last wafer of the lot, the judgment in step 134 is affirmed, which completes the series of processing in the main routine.

As is obvious from the description so far, in the embodiment, a stage unit is configured including each section that constitutes wafer stage unit 12 and main controller 20 that functions as a stage control unit.

As is described in detail in the description above, according to the stage unit related to the embodiment, when wafer stage WST moves in a first direction (e.g. the +X direction), main controller 20 (control unit) gives initial velocity $v_0$ in the first direction (e.g. the +X direction) to counter mass 30, and from this, when wafer stage WST moves in the first direction driven by X-axis linear motor 80, counter mass 30 moves in the direction opposite to the first direction according to the law of conservation of momentum due to the reaction force of the drive force. And on this movement, movement in the first direction caused by the initial velocity is also simultaneously performed, therefore, as a consequence, counter mass 30 moves in the direction opposite to the first direction only by a distance of the movement distance in the first direction caused by the initial velocity subtracted from the movement distance of counter mass 30 during free motion according to the law of conservation of momentum due to the reaction force of the drive force that drives wafer stage WST in the first direction, and the movement distance of counter mass 30 becomes shorter.

Further, in the embodiment, because wafer stage WST moves in the first direction (e.g. the +X direction) accompanied by acceleration and deceleration, counter mass 30 is accelerated in the first direction (refer to FIG. 9A) while wafer stage WST is being decelerated, which can further reduce the movement distance in the direction opposite to the first direction of counter mass 30 affected by the reaction force of the drive force of wafer stage WST in the first direction.

Accordingly, with the stage unit related to the embodiment, the strokes required for moving counter mass 30 can be shortened without necessarily increasing the size of counter mass 30 (the second moving body). Especially, because wafer stage WST (the first moving body) performs an operation that includes a stepping movement in the first direction, that is, because wafer stage WST alternately repeats acceleration and deceleration in the first direction (e.g. the +X direction), strokes required for moving counter mass 30 in the X-axis direction (a first axis direction) can be made the shortest.

Further, in the stage unit related to the embodiment, main controller 20 (control unit) gives counter mass 30 the initial velocity so that the center of mass of wafer stage WST, counter mass 30, and the system including wafer stage WST and counter mass 30 performs a constant velocity motion in the X-axis direction. As a consequence, while exposure of a plurality of shot areas in the same row on wafer W is performed, counter mass 30 performs a reciprocal motion within the range of $\pm\Delta x$ with the position of wafer stage WST serving as a reference, with respect to wafer stage WST that gradually moves in the +X direction (or −X direction) while alternately repeating stepping and stopping, as is obvious from FIGS. 8, 9A, and 9B. Accordingly, as the strokes of counter mass 30, only a distance of $2\Delta x$ with some margin added has to be prepared.

Further, as is previously described, in the stage unit related to the embodiment, as it can be seen from FIG. 9B, by main controller 20 setting the position of counter mass 30 offset by $\Delta x$ along the first direction (e.g. the +X direction) and giving initial velocity $V_0$ to counter mass 30 when the stage moves in the first direction, such as the point when the stepping of wafer stage WST begins, a similar action and effect can be obtained as in the case when initial velocity $V_0$ is given to counter mass 30 in advance.

Furthermore, according to exposure apparatus 100 of the embodiment, because a stage unit that can shorten the strokes required for moving counter mass 30 without necessarily increasing the size of counter mass 30 is used as wafer stage unit 12 (the drive unit of wafer W), the size of the whole apparatus can be reduced by the smaller wafer stage unit 12. Further, according to exposure apparatus 100 of the embodiment, because the reaction force that occurs during the drive of wafer stage WST is absorbed by the movement of counter mass 30 according to the law of conservation of momentum, the influence of vibration due to the drive of stage WST can almost be removed, which makes it possible improve the transfer accuracy (exposure accuracy) of the pattern by the improvement in position controllability of the wafer stage, or consequently, the position controllability of the wafer.

In the embodiment above, for example, the case has been described where the position of counter mass 30 was set offset when the stepping of wafer stage WST begins and an initial velocity was also given, however, the present invention is not limited to this, and main controller 20 can set the position of counter mass 30 offset by $\Delta x$ along the first direction (e.g. the +X direction), without giving any initial velocity. Even in such a case, when wafer stage WST moves in the first direction (e.g. the +X direction), counter mass 30 moves in the direction opposite to the first direction by the reaction force of the drive force, however, the movement distance of counter mass 30 is canceled out by the offset amount, which makes the movement distance of counter mass 30 in the direction opposite to the first direction shorter by the offset amount, which in turn allows the strokes of the counter mass to be set short.

In the embodiment above, for the sake of simplicity of the description, the case has been described where exposure was performed on a plurality of (I×J) shot areas $S_{i,j}$ (refer to FIG. 7) arranged in a matrix on wafer W, however, it is a matter of course that the present invention is not limited to this. Normally, on a wafer, shot areas are formed in an arrangement of a matrix with a part of the shot areas chipped, and in some cases after exposure has been completed of the last shot area in a certain row, during the movement operation of the wafer stage between shots before starting exposure of the first shot are in the next row, a movement operation in between shots that is accompanied with a turnback movement of two columns in the X-axis direction and a movement in the Y-axis direction (hereinafter referred to as "linefeed timing two column jumping movement operation") may be required. In such a case, it is preferable that X-trim motor begins to give thrust to counter mass 30 for the turnback movement of two columns in the X-axis direction while the exposure of the last shot area in a certain row is being performed, and to start the movement of wafer stage WST in the X-axis direction as soon as the exposure has been completed. Further, control of counter mass 30 or the like as in the linefeed timing two column jumping movement operation described above can also be performed during the movement between sample shot areas for mark detection of the sample shot areas in the EGA.

Figure 10:
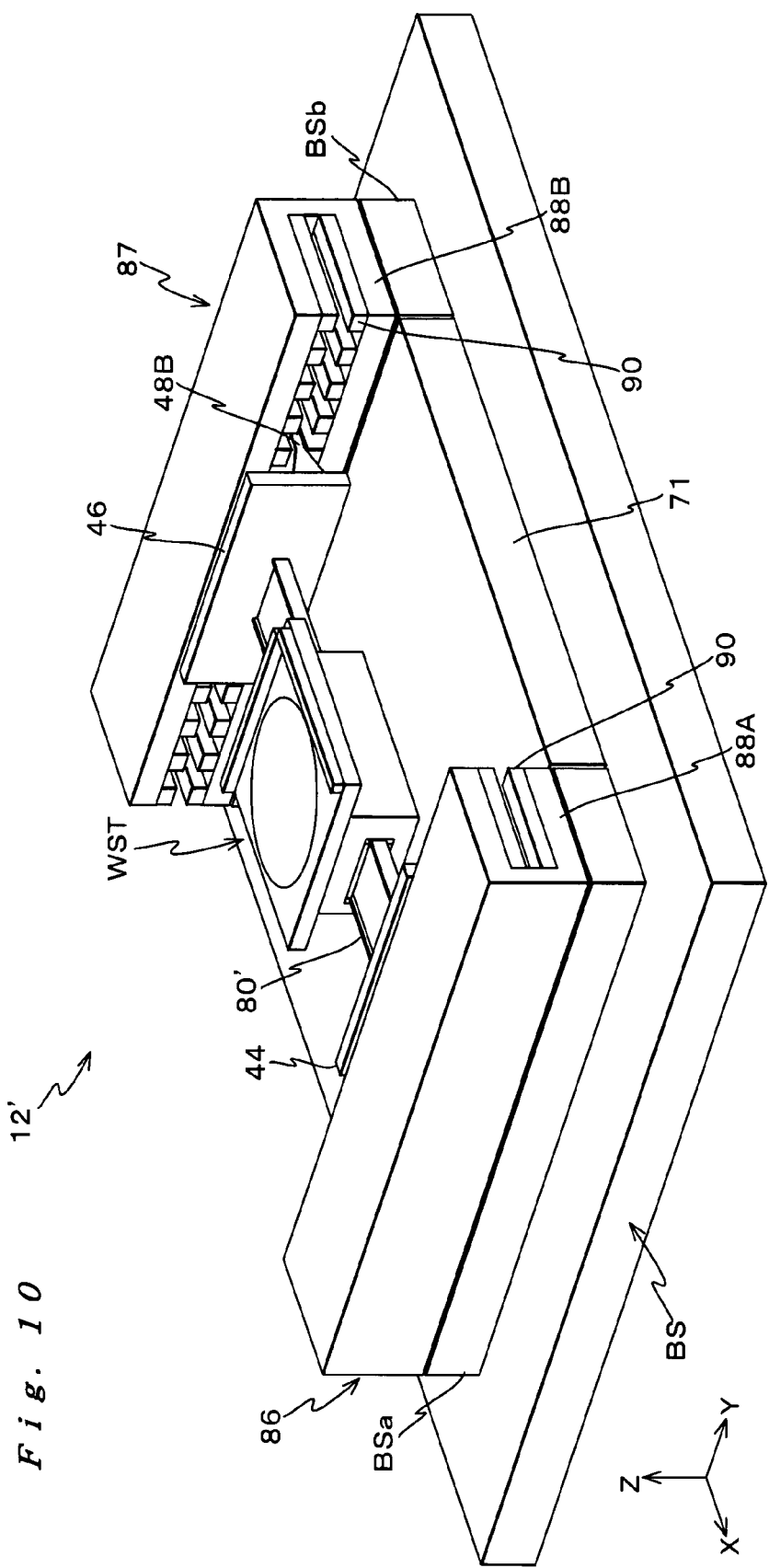
FIG. 10 is a perspective view of a stage unit related to a first modified example.

FIG. 10 shows a perspective view of a stage unit 12' related to a first modified example of wafer stage unit 12 in FIG. 2. Stage unit 12' is a unit that has counter mass 30, X-axis movers 24A and 24B arranged in the counter mass, X-axis stators 26A and 26B corresponding to X-axis movers 24A and 24B and the like removed from wafer stage unit 12 previously described and also has the counter mass functions added to Y-axis stators 86 and 87. In this case, in stead of armature unit 80, an armature unit 80' (an X-axis stator) that has sliders 44 and 46 fixed to both ends in the longitudinal direction similar to X-axis stators 26A and 26B previously described is arranged, and armature unit 80' and the pair of magnetic pole units 22A and 22B previously described constitute an X-axis linear motor that drives wafer stage WST in the X-axis direction. Further, in stage unit 12' related to the modified example, stoppers described earlier that keep Y-axis stators 86 and 87 from moving in the X-axis direction are not arranged in protruded sections BSa and BSb previously described.

Figure 11A:
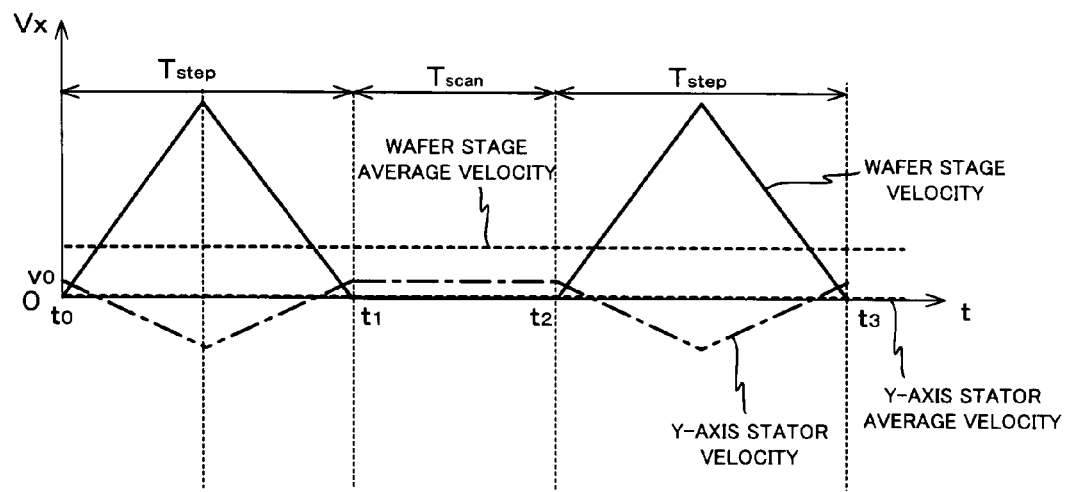
FIG. 11A is a view that shows a temporal change curve of velocity of a wafer stage WST and Y-axis stators 86 and 87 in the X-axis direction.

FIG. 11A shows a temporal change curve of the velocity of wafer stage WST and Y-axis stators 86 and 87 in the X-axis direction. The temporal change curve of the velocity of wafer stage WST in FIG. 11A is a temporal change curve similar to the one shown in FIG. 9A, and the temporal change curve of the velocity of Y-axis stators 86 and 87 is similar to the temporal change curve of the velocity of counter mass 30 in the X-axis direction shown in FIG. 9A.

Figure 11B:
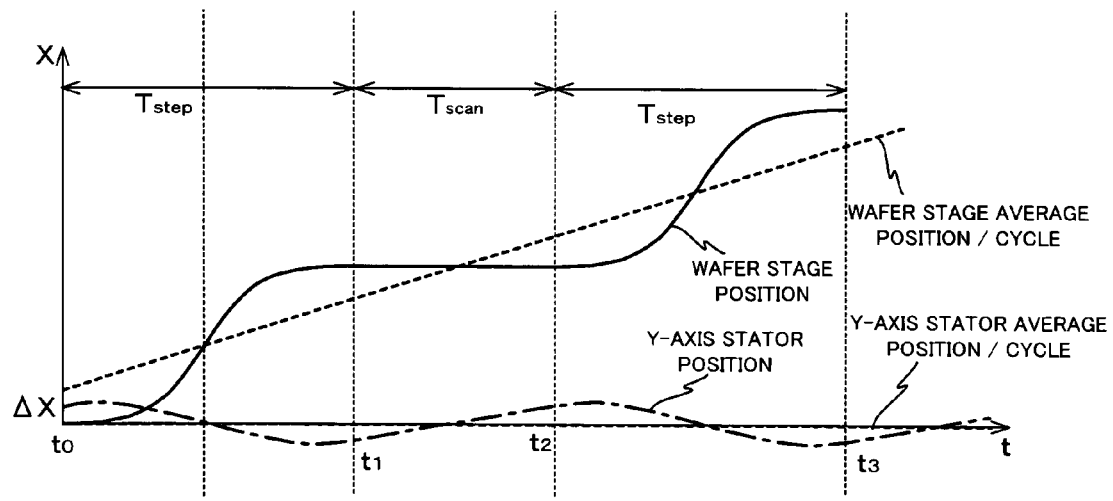
FIG. 11B is a view that shows a temporal change curve of position of a wafer stage WST and Y-axis stators 86 and 87 in the X-axis direction.

FIG. 11B shows the temporal curve of the position of wafer stage WST and Y-axis stators 86 and 87 in the X-axis direction. From FIGS. 11A and 11B, it can be seen that while wafer stage WST performs the stepping operation and the scanning operation, Y-axis stators 86 and 87 return back to their positions in the X-axis direction after moving along in the X-axis direction at a predetermined stroke of $2\Delta X$.

Figure 12:
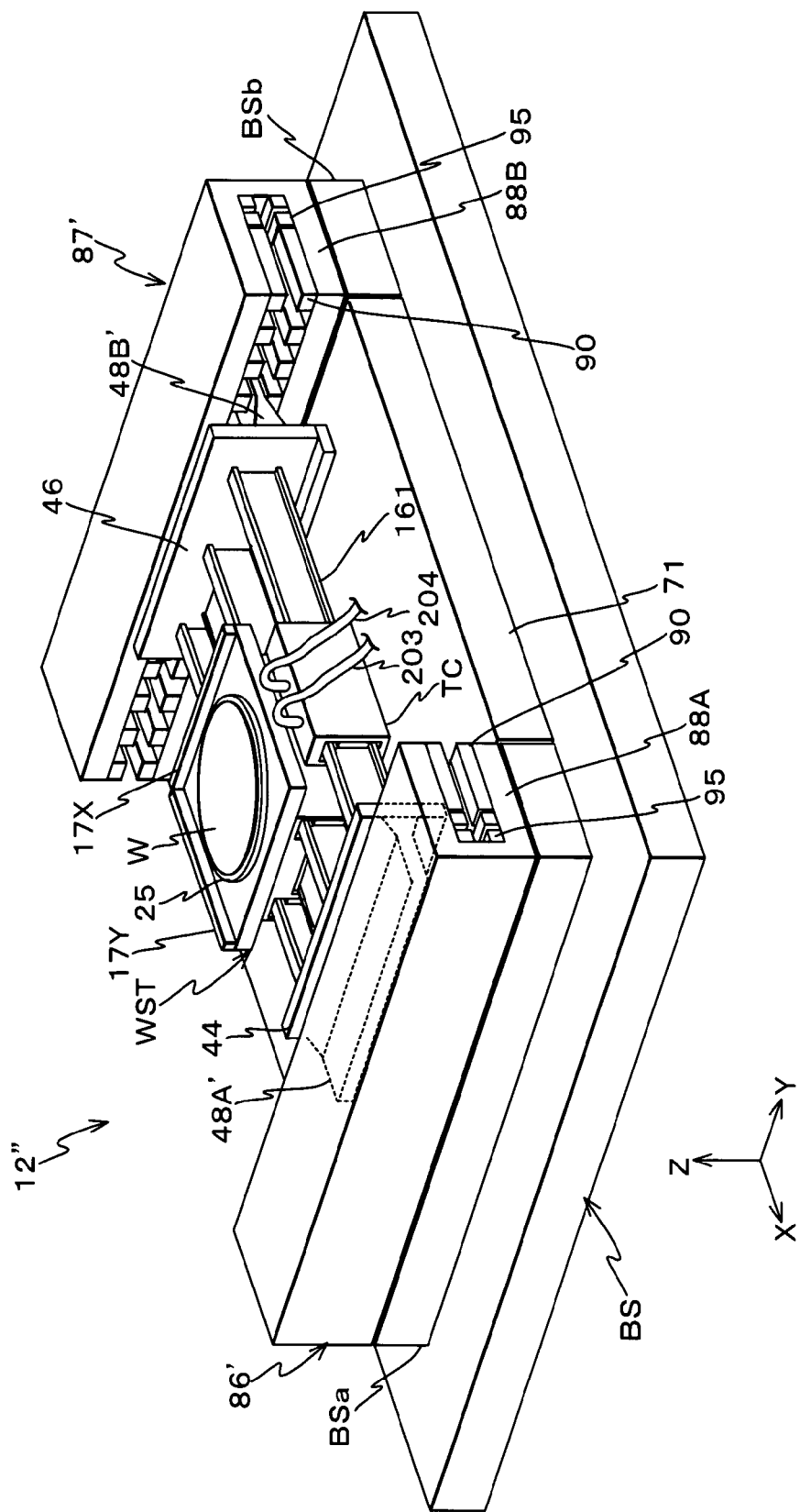
FIG. 12 is a perspective view of a stage unit related to a second modified example.
Figure 13A:
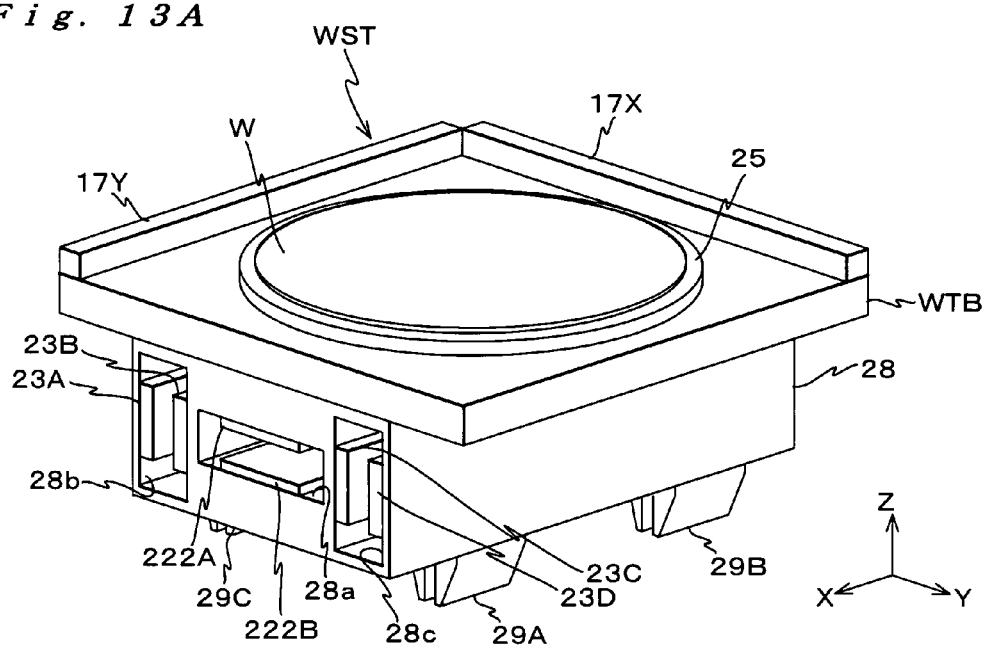
FIG. 13A is a perspective view that shows a wafer stage related to a second modified example.
Figure 13B:
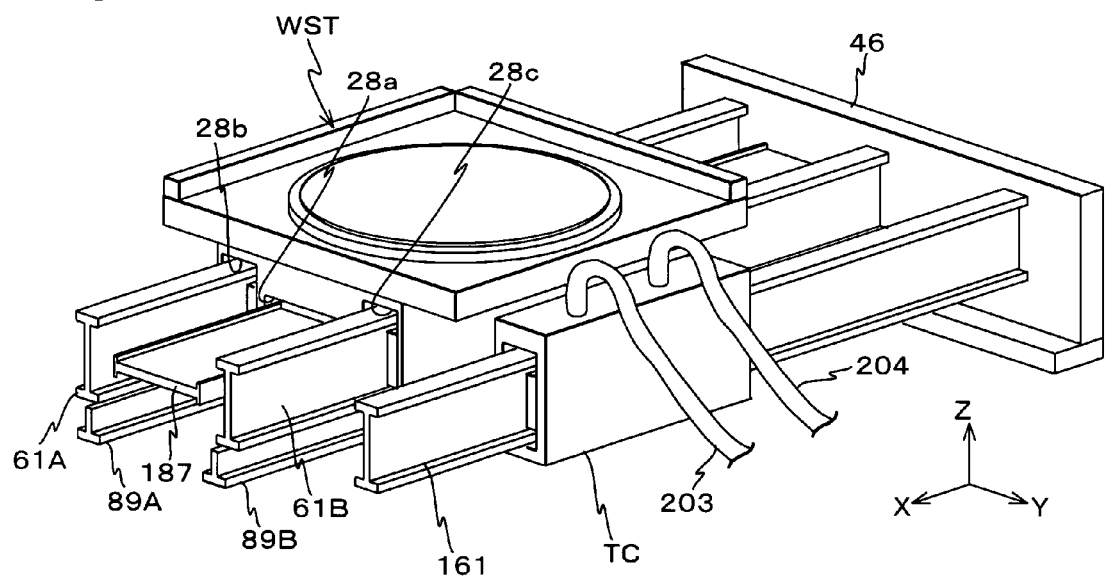
FIG. 13B is a perspective view that shows a state where the wafer stage in FIG. 13A is engaged with a stator.

FIGS. 12, 13A, and 13B show a stage unit 12" related to a second modified example of wafer stage unit 12 in FIG. 2. Stage unit 12" does not have counter mass 30, which was arranged in wafer stage unit 12 in FIG. 2, as in stage unit 12' related to the first modified example shown in FIG. 10. Details on stage unit 12" will be described below, however, for parts that have the same or similar arrangement as wafer stage unit 12 in FIG. 2, the same reference numerals (or the same reference numerals with an apostrophe) will be used, and the description thereabout will be omitted. In stage unit 12" in FIGS. 12, 13A, and 13B, a wafer holder 25 is shown, which was omitted in wafer stage unit 12 in FIG. 2.

In stage unit 12", mainly the drive structure for driving wafer stage WST, the drive structure for driving sliders 46 and 44, the reaction force processing mechanism for processing the reaction force in the X-axis direction with sliders 46 and 44 serving as the counter mass, and a tube carrier structure for supplying power usage such as compressed air and vacuum to wafer stage WST differ from (are added to) wafer stage unit 12 in FIG. 2.

As is shown in FIG. 13A, in wafer stage main body 28, three openings 28a, 28b, and 28c are formed that penetrate wafer stage main body 28 in the X-axis direction.

In opening 28a, a pair of permanent magnets 222A and 222B is arranged as a Y-axis mover, and in openings 28b and 28c, a pair of magnetic pole units 23A and 23B and a pair of magnetic pole units 23C and 23D whose structure is the same as movers 24A and 24B previously described are respectively arranged as X-axis movers.

Meanwhile, as is obvious when totally viewing FIGS. 13B and 12, between slider 46 and slider 44, a Y-axis stator 187 that finely drives wafer stage WST in the Y-axis direction working with the pair of permanent magnets 222A and 222B, and X-axis stators 61A and 61B that drive wafer stage WST in the X-axis direction with long strokes working with the pair of magnetic pole units 23A and 23B and the pair of magnetic pole units 23C and 23D are arranged.

Further by making the Lorentz force generated by the pair of magnetic pole units 23A and 23B and X-axis stator 61A and the Lorentz force generated by the pair of magnetic pole units 23C and 23D and X-axis stator 61B differ, wafer stage WST can be rotated in the $\theta z$ direction.

Furthermore, below wafer stage main body 28, as is shown in FIG. 13A, four permanent magnets 29A, 29B, 29C, and 29D (however, permanent magnet 29D positioned in the depth of the page surface of FIG. 13A is not shown) are arranged as Z-axis movers. On the other hand, as is obvious when totally viewing FIGS. 13B and 12, between slider 46 and slider 44, a Z-axis stator (coil) 89B that generates a drive force in the Z-axis direction working with permanent magnets 29A and 29B, and a Z-axis stator (coil) 89A that generates a drive force in the Z-axis direction working with permanent magnets 29C and 29D are arranged. That is, by controlling the current supplied to the coils that make up Z-axis stators 89A and 89B, wafer stage WST can be driven in the Z-axis direction, and the $\theta x$ and $\theta y$ directions.

Referring back to FIG. 12, Y-axis linear motors 86' and 87' related to the second modified example are made up of movers 48A' and 48B' that are equipped with armature coils and stators consisting of magnetic pole units, respectively. The stator of Y-axis linear motor 86' has a stator yoke 88A, a plurality of permanent magnets 90, which are arranged on a vertical opposing surface inside the stator yoke, extending narrowly in the X-axis direction, and a plurality of, e.g. two, permanent magnets 95 extending in the Y-axis direction. The stator of Y-axis linear motor 87' is configured in a similar manner as the stator of Y-axis linear motor 86', including a stator yoke 88B, permanent magnets 90, and permanent magnets 95.

Although it is not shown, mover 48B' (or mover 48A') has a first coil that extends in the X-axis direction and a second coil that extends in the Y-axis direction. When a current is supplied to the first coil, a Lorentz force that drives slider 46 (or slider 44) in the Y-axis direction is generated by the electromagnetic interaction with permanent magnet 90. Further, when a current is supplied to the second coil, a Lorentz force that drives slider 46 (or slider 44) in the X-axis direction is generated by the electromagnetic interaction with permanent magnet 95.

In the second modified example, sliders 46 and 44 (and each of the stators (187, 61A, 61B, 89A, and 89B)) are supported movable on stage base 71 in the X-axis direction by air bearings (not shown), and function as an X counter mass. That is, slider 46, 44 and the like moves in the direction opposite to wafer stage WST by the reaction force when wafer stage WST moves in the X-axis direction.

Furthermore, in the second modified example, in order to reduce the movement strokes of sliders 46, 44 and the like in the X-axis direction, when wafer stage WST moves in the X-axis direction, the second coil and permanent magnet 95 described earlier give an initial velocity to slider 46 that moves slider 46 in the same direction as wafer stage WST.

If necessary, the position of sliders 46 and 44 in the X-axis direction can be adjusted, using the second coil and permanent magnet 95.

Further, in the case the reaction force of wafer stage WST in the X-axis direction cannot be completely canceled by sliders 46 and 44 due to weight limitation of sliders 46 and 44, at least one of the stators of Y-axis linear motors 86' and 87' can be moved in the X-axis direction by the reaction force of wafer stage WST so that the reaction force can be canceled out.

In the second modified example, is shown in FIGS. 12 and 13B, in the vicinity of wafer stage WST, a tube carrier TC is arranged. Tube carrier TC is used for supplying power usage such as compressed air or vacuum to wafer stage WST, and connects to an air supply pipe 203 and an exhaust pipe 204.

Further, in order to prevent disturbance from affecting wafer stage WST, tube carrier TC can be driven in the X-axis direction by a permanent magnet arranged inside tube carrier TC and a stator 161 (coil) supported by sliders 46 and 44. The drive of tube carrier TC in the X-axis direction does not necessarily have to follow the drive of wafer stage WST in the X-axis direction in a rigorous manner, and the drive of tube carrier TC only has to follow within a permissible range.

Therefore, in the second modified example, in order to reduce the influence of the reaction force generated by the drive of tube carrier TC on wafer stage WST, main controller 20 controls tube carrier TC so as to make tube carrier TC perform constant velocity movement.

Further, when tube carrier TC is located on the edge in the +X direction or on the edge in the −X direction, an initial velocity can be given to tube carrier TC along the same direction as the movement direction of wafer stage WST.

The concept of wafer stage WST and the drive unit shown in the embodiment described above or in the modified example can be appropriately improved and applied to reticle stage RST.

In the embodiment above, the case has been described where the present invention is applied to a scanning stepper. The application scope of the present invention, however, is not limited to this, and the present invention can also be suitably applied to a static exposure apparatus such as stepper that performs exposure in a state where the mask and the substrate are static. In the case of a stepper, since exposure is performed by the step-and-repeat method, in the case of focusing on, for example, the X-axis direction, temporal change curves similar to the ones shown in FIGS. 9A and 9B can be obtained as in the embodiment described above, therefore, the present invention can be suitably applied. Further, from a similar point, the present invention can be suitably applied to an exposure apparatus by the step-and-stitch method.

Further, the object subject to exposure of the exposure apparatus is not limited to the wafer used for manufacturing semiconductor devices as in the embodiment described above. For example, the present invention can be widely applied to a square shaped glass plate for manufacturing display units such as a liquid crystal displays device, a plasma display, and an organic EL, or to a substrate for manufacturing a thin-film magnetic head, an imaging device (such as a CCD), a mask, a reticle or the like.

Further, the magnification of the projection optical system in the exposure apparatus of the embodiment above is not limited to a reduction system, and the system may be either an equal magnifying system or a magnifying system. Also, projection optical system PL is not limited to a dioptric system, and the system may be a catoptric system or a catadioptric system, and the projected image may be either of an inverted image or an upright image.

Further, illumination light IL can be an ArF excimer laser beam (wavelength: 193 nm), a KrF excimer laser beam (wavelength: 248 nm), an $F_2$ laser beam (wavelength: 157 nm) or the like. As the projection optical system, in the case of using far ultraviolet light such as the KrF excimer laser beam, the ArF excimer laser beam or the like, materials that transmit the far ultraviolet light such as quartz, fluorite and the like are used as the glass material, and in the case of using the $F_2$ laser beam or the like, materials such as fluorite or other fluoride crystals have to be used.

Further, for example, as the vacuum ultraviolet light, the ArF excimer laser beam or the $F_2$ laser beam is used, however, other than these beams, a harmonic wave may also be used that is obtained by amplifying a single-wavelength laser beam in the infrared or visible range emitted by a DFB semiconductor laser or fiber laser, with a fiber amplifier doped with, for example, erbium (or both erbium and ytterbium), and by converting the wavelength into ultraviolet light using a non-linear optical crystal.

Further, in the embodiment above, as illumination light IL of the exposure apparatus, the light is not limited to light having the wavelength equal to or greater than 100 nm, and it is needless to say that light having the wavelength less than 100 nm can also be used. For example, in recent years, in order to expose a pattern equal to or less than 70 nm, development is performed of an EUV exposure apparatus that makes an SOR or a plasma laser as a light source generate an EUV (Extreme Ultraviolet) light in a soft X-ray range (such as a wavelength range from 5 to 15 nm), and uses a total reflection reduction optical system designed under the exposure wavelength (such as 13.5 nm) and the reflective type mask. In the EUV exposure apparatus, the arrangement in which scanning exposure is performed by synchronously scanning a mask and a wafer using a circular arc illumination can be considered, therefore such an apparatus can also measure the transfer characteristics of the pattern by the transfer characteristics measurement method of the present invention. Furthermore, for example, the present invention can also be suitably applied to an immersion exposure apparatus that has liquid (e.g. pure water or the like) filled in between projection optical system PL and a wafer whose details are disclosed in, for example, the pamphlet of International Publication WO99/49504 and the like.

Further, the present invention can also be applied to an exposure apparatus that uses a charged particle beam such as an electron beam or an ion beam. Incidentally, the electron beam exposure apparatus can be an apparatus by any one of a pencil beam method, a variable-shaped beam method, a self-projection method, a blanking aperture array method, and a mask projection method.

The stage unit related to the present invention can be applied not only to an exposure apparatus, but can also be widely applied to other substrate processing units (e.g. a laser repair unit, substrate inspection unit or the like), or to a position unit of a sample in other precision machinery, a wire bonding apparatus or the like.

The exposure apparatus in the present invention such as exposure apparatus 100 or the like in the embodiment described above can be made, first of all, by incorporating an illumination unit made up of a plurality of lenses, a projection optical system and the like into the main body of the exposure apparatus, and then optical adjustment is performed. Next, parts described above such as the X-axis stator, the X-axis mover, the Y-axis stator, the wafer stage, the reticle stage, and other various parts are also mechanically and electrically combined and adjusted. And then, total adjustment (such as electrical adjustment and operation check) is performed, which completes the making of the exposure apparatus. The exposure apparatus is preferably built in a clean room where conditions such as the temperature and the degree of cleanliness are controlled.

Semiconductor devices are manufactured through the following steps: a step where the function/performance design of a device is performed; a step where a reticle based on the design step is manufactured; a step where a wafer is manufactured using materials such as silicon; a lithography step where the pattern formed on the mask is transferred onto a photosensitive object by the exposure apparatus described in the embodiment above; a device assembly step (including processes such as dicing process, bonding process, and packaging process); inspection step, and the like. In this case, in the lithography step, because the exposure apparatus in the embodiment above is used, high integration devices can be manufactured with good yield.

INDUSTRIAL APPLICABILITY

The driving method of a moving body in the present invention is suitable for driving a first moving body and a second moving body that moves in the opposite direction of the first moving body due to the reaction of the drive force of the first moving body. The stage unit of the present invention is suitable for an exposure apparatus or a substrate processing unit in an apparatus besides an exposure apparatus, or a drive unit of a sample (or a substrate) in other precision machinery. Further, the exposure apparatus of the present invention is suitable for producing microdevices.

What is claimed is:

1. A drive method of a moving body in which a first moving body that moves in at least a first axis direction and a second moving body that moves in an opposite direction of the first moving body due to a reaction force of a drive force in the first axis direction of the first moving body are driven, the method comprising:
    moving the first moving body with a first drive unit in a first direction out of two directions in the first axis direction; and
    giving an initial velocity in the first direction to the second moving body with a second drive unit when the first moving body moves in the first direction, wherein
    a mass of a system including the first moving body and the second moving body performs a movement in the first axis direction which does not include a second direction out of two directions in the first axis direction by giving the initial velocity to the second moving body.

2. The drive method of a moving body according to claim 1 wherein
    the initial velocity is given to the second moving body at a timing prior to the start of movement of the first moving body.

3. The drive method of a moving body according to claim 1 wherein
    the initial velocity is given to the second moving body at substantially the same timing as the start of movement of the first moving body.

4. The drive method of a moving body according to claim 1 wherein
    the initial velocity given to the second moving body is decided based on a mass of the first moving body and a mass of the second moving body.

5. The drive method of a moving body according to claim 1 wherein
    the initial velocity given to the second moving body is set so that a center of mass of the system performs a constant velocity movement in the first axis direction.

6. The drive method of a moving body according to claim 1 wherein
    the first moving body can be moved in a second axis direction orthogonal to the first axis direction, and
    while the first moving body moves in the first direction and in a second direction out of two directions in the second axis direction, the second moving body performs a reciprocal movement along the first axis direction.

7. An exposure method of forming a pattern by irradiating an object with an illumination light, the method comprising:
    moving a body by the drive method according to claim 1 with a support member, which supports the object, serving as the moving body, when the support member is moved during a processing operation of an exposure process to the object.

8. An exposure method of projecting a pattern formed on a mask onto an object, the method comprising:
    moving a body by the drive method according to claim 1 with a mask support member, which supports the mask, serving as the moving body, when the mask support member is moved during a processing operation of an exposure process to the object.

9. A device manufacturing method, comprising:
    exposing an object by the exposure method according to claim 7; and
    developing the object to form the device.

10. A device manufacturing method, comprising:
    exposing an object by the exposure method according to claim 8; and
    developing the object to form the device.

11. The drive method according to claim 1 wherein
    the first moving body is a stage unit, and the second moving body is a counter mass.

12. The exposure method according to claim 8, wherein
    during the processing operation, the mask and the substrate move synchronously in a predetermined scan direction which is substantially perpendicular to the first axis direction.

13. A drive method of a moving body in which a first moving body that moves in at least a first axis direction and a second moving body that moves in an opposite direction of the first moving body due to a reaction force of a drive force in the first axis direction of the first moving body are driven, the method comprising:
    moving the first moving body with a first drive unit in a first direction out of two directions in the first axis direction; and
    performing position setting of the second moving body offset in the first direction, with a second drive unit, when the first moving body moves in the first direction, wherein
    a mass of a system including the first moving body and the second moving body performs a movement in the first axis direction which does not include a second direction out of two directions in the first axis direction by setting of the offset.

14. The drive method of a moving body according to claim 13 wherein
    an amount of the offset is decided based on a mass of the first moving body and a mass of the second moving body.

15. The drive method of a moving body according to claim 13 wherein
    when the first moving body moves in the first direction, an initial velocity in the first direction is given to the second moving body.

16. An exposure method of forming a pattern by irradiating an object with an illumination light, the method comprising:
    moving a body by the drive method according to claim 13 with a support member, which supports the object, serving as the moving body, when the support member is moved during a processing operation of an exposure process to the object.

17. The drive method of a moving body according to claim 15 wherein
the initial velocity given to the second moving body is set so that a center of mass of the system performs a constant velocity movement in the first axis direction.

18. The drive method according to claim 13 wherein
the first moving body is a stage unit, and the second moving body is a counter mass.

19. The exposure method according to claim 16, wherein
during the processing operation, the mask and the substrate move synchronously in a predetermined scan direction which is substantially perpendicular to the first axis direction.

20. An exposure method of projecting a pattern formed on a mask onto an object, the method comprising:
moving a body by the drive method according to claim 13 with a mask support member, which supports the mask, serving as the moving body, when the mask support member is moved during a processing operation of an exposure process to the object.

21. A device manufacturing method, comprising:
exposing an object by the exposure method according to claim 16; and
developing the object to form the device.

22. A device manufacturing method, comprising:
exposing an object by the exposure method according to claim 20; and
developing the object to form the device.

23. A stage unit, comprising:
a stage that moves at least in a first axis direction;
a first drive unit that drives the stage;
a counter mass that moves in an opposite direction of the stage due to an action of a reaction force of a drive force of the stage in the first axis direction by the first drive unit;
a second drive unit that drives the counter mass in the first axis direction; and
a control unit that controls the second drive unit and gives the counter mass an initial velocity in a first direction out of two directions in the first axis direction when the stage is moved in the first direction via the first drive unit, wherein
a mass of a system including the first moving body and the second moving body performs a movement in the first axis direction which does not include a second direction out of two directions in the first axis direction by giving the initial velocity to the second moving body by the control unit.

24. The stage unit according to claim 23 wherein
the control unit gives the initial velocity to the counter mass prior to the start of movement of the stage.

25. The stage unit according to claim 23 wherein
the control unit gives the initial velocity to the counter mass almost simultaneously to the start of movement of the stage.

26. The stage unit according to claim 23 wherein
the control unit gives the initial velocity to the counter mass based on a mass of the stage and a mass of the counter mass.

27. The stage unit according to claim 23 wherein
the control unit gives the initial velocity to the counter mass so that a center of mass of the system performs a constant velocity movement in the first axis direction.

28. The stage unit according to claim 23 wherein
the stage can be driven in a second axis direction orthogonal to the first axis direction, and
the control unit makes the counter mass perform a reciprocal movement along the first axis direction while the stage moves in the first direction and in a second direction out of two directions in the second axis direction.

29. An exposure apparatus that transfers a pattern on an object, the apparatus comprising:
a stage unit according to claim 23 on which the object is held as a drive unit of the object.

30. A device manufacturing method, comprising:
exposing an object by the exposure apparatus according to claim 29; and
developing the object to form the device.

31. The exposure apparatus according to claim 29, wherein
during the exposure operation, the mask and the substrate move synchronously in a predetermined scan direction which is substantially perpendicular to the first axis direction.

32. A stage unit, comprising:
a stage that moves at least in a first axis direction;
a first drive unit that drives the stage;
a counter mass that moves in an opposite direction of the stage due to an action of a reaction force of a drive force of the stage in the first axis direction by the first drive unit;
a second drive unit that drives the counter mass in the first axis direction; and
a control unit that controls the second drive unit and performs position setting of the counter mass offset in a first direction out of two directions in the first axis direction when the stage is moved in the first direction via the first drive unit, wherein
a mass of a system including the first moving body and the second moving body performs a movement in the first axis direction which does not include a second direction out of two directions in the first axis direction by setting of the offset by the control unit.

33. The stage unit according to claim 32, wherein
the control unit decides an amount of the offset based on a mass of the stage and a mass of the counter mass.

34. The stage unit according to claim 32, wherein
the control unit gives the counter mass an initial velocity in the first direction when the stage moves in the first direction.

35. An exposure apparatus that transfers a pattern on an object, the apparatus comprising:
a stage unit according to claim 32 on which the object is held as a drive unit of the object.

36. A device manufacturing method, comprising:
exposing an object by the exposure apparatus according to claim 35; and
developing the object to form the device.

37. The stage unit according to claim 34 wherein
the control unit gives the initial velocity to the counter mass so that a center of mass of the system performs a constant velocity movement in the first axis direction.

38. The exposure apparatus according to claim 35, wherein
during the exposure operation, the mask and the substrate move synchronously in a predetermined scan direction which is substantially perpendicular to the first axis direction.

39. A drive method in which a first moving body that moves in at least a first axis direction and a second moving body that supplies power usage to the first moving body and also moves in the same direction as the first moving body are driven, the method comprising:

moving the first moving body with a first drive unit in a first direction in the first axis direction; and giving an initial velocity in the first direction to the second moving body with a second drive unit when the first moving body moves in the first direction, wherein the second moving body is made to perform a constant velocity movement after the initial velocity is given to the second moving body.

40. An exposure method of forming a pattern by irradiating an object with an illumination light, the method comprising:

driving a body by the drive method according to claim 39 with a support member, which supports the object, serving as the moving body, when the support member is moved during a processing operation of an exposure process to the object.

41. An exposure method of projecting a pattern formed on a mask onto an object, the method comprising:

driving a body by the drive method according to claim 39 with a mask support member, which supports the mask, serving as the moving body, when the mask support member is moved during a processing operation of an exposure process to the object.

42. A device manufacturing method, comprising:

exposing an object by the exposure method according to claim 40; and developing the object to form the device.

43. A device manufacturing method, comprising:

exposing an object by the exposure method according to claim 41; and developing the object to form the device.

44. The drive method according to claim 39 wherein the first moving body is a stage unit, and the second moving body is a counter mass.

45. The exposure method according to claim 40, wherein during the processing operation, the mask and the substrate move synchronously in a predetermined scan direction which is substantially perpendicular to the first axis direction.

46. The exposure method according to claim 41, wherein during the processing operation, the mask and the substrate move synchronously in a predetermined scan direction which is substantially perpendicular to the first axis direction.

* * * * *